(12) United States Patent
Tokuya et al.

(10) Patent No.: US 11,469,187 B2
(45) Date of Patent: Oct. 11, 2022

(54) SEMICONDUCTOR DEVICE AND HIGH-FREQUENCY MODULE

(71) Applicant: Murata Manufacturing Co., Ltd., Kyoto-fu (JP)

(72) Inventors: Hiroaki Tokuya, Nagaokakyo (JP); Masahiro Shibata, Nagaokakyo (JP); Akihiko Ozaki, Nagaokakyo (JP); Satoshi Goto, Nagaokakyo (JP); Fumio Harima, Nagaokakyo (JP); Atsushi Kurokawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 67 days.

(21) Appl. No.: 16/943,243

(22) Filed: Jul. 30, 2020

(65) Prior Publication Data

US 2021/0035922 A1 Feb. 4, 2021

(30) Foreign Application Priority Data

Jul. 31, 2019 (JP) .............................. JP2019-141341
Apr. 20, 2020 (JP) .............................. JP2020-074812

(51) Int. Cl.
*H01L 29/737* (2006.01)
*H01L 27/082* (2006.01)
(Continued)

(52) U.S. Cl.
CPC ...... *H01L 23/562* (2013.01); *H01L 23/49838* (2013.01); *H01L 23/66* (2013.01);
(Continued)

(58) Field of Classification Search
CPC ..................................................... H01L 23/562
See application file for complete search history.

(56) References Cited

U.S. PATENT DOCUMENTS

2006/0197191 A1* 9/2006 Tsai ........................ H01L 24/02
257/E23.021
2016/0315060 A1* 10/2016 Umemoto ............... H01L 24/05
(Continued)

FOREIGN PATENT DOCUMENTS

JP 2000349189 A 12/2000
JP 2003077930 A 3/2003
(Continued)

*Primary Examiner* — William A Harriston
(74) *Attorney, Agent, or Firm* — Studebaker & Brackett PC

(57) ABSTRACT

At least one unit transistor is arranged over a substrate. A first wiring as a path of current that flows to each unit transistor is arranged over the at least one unit transistor. An inorganic insulation film is arranged over the first wiring. At least one first opening overlapping a partial region of the first wiring in a plan view is provided in the inorganic insulation film. An organic insulation film is arranged over the inorganic insulation film. A second wiring coupled to the first wiring through the first opening is arranged over the organic insulation film and the inorganic insulation film. In a plan view, a region in which the organic insulation film is not arranged is provided outside a region in which the first wiring is arranged. The second wiring is in contact with the inorganic insulation film outside the region in which the first wiring is arranged.

20 Claims, 17 Drawing Sheets

(51) Int. Cl.
*H01L 23/498* (2006.01)
*H01L 23/66* (2006.01)
*H01L 23/00* (2006.01)

(52) U.S. Cl.
CPC ............ *H01L 24/13* (2013.01); *H01L 24/16* (2013.01); *H01L 27/0823* (2013.01); *H01L 29/7371* (2013.01); *H01L 2223/6655* (2013.01); *H01L 2224/13026* (2013.01); *H01L 2224/16227* (2013.01); *H01L 2924/13051* (2013.01); *H01L 2924/1421* (2013.01); *H01L 2924/351* (2013.01)

(56) References Cited

U.S. PATENT DOCUMENTS

| | | | |
|---|---|---|---|
| 2017/0359030 A1* | 12/2017 | Obu | H03F 3/195 |
| 2019/0172807 A1* | 6/2019 | Kurokawa | H01L 29/0813 |
| 2019/0267479 A1* | 8/2019 | Kurokawa | H01L 29/0813 |
| 2022/0122901 A1* | 4/2022 | Takahashi | H01L 24/08 |

FOREIGN PATENT DOCUMENTS

| | | | |
|---|---|---|---|
| JP | 2009194144 A | 8/2009 | |
| JP | 2019114750 A | 7/2019 | |
| JP | 2019149485 A | 9/2019 | |

\* cited by examiner

SEMICONDUCTOR DEVICE AND HIGH-FREQUENCY MODULE

CROSS-REFERENCE TO RELATED APPLICATIONS

This application claims benefit of priority to Japanese Patent Application No. 2019-141341, filed Jul. 31, 2019, and to Japanese Patent Application No. 2020-074812, filed Apr. 20, 2020, the entire contents of each are incorporated herein by reference.

BACKGROUND

Technical Field

The present disclosure relates to semiconductor devices and high-frequency modules.

Background Art

Japanese Unexamined Patent Application Publication No. 2003-77930, described below, discloses a semiconductor device including a heterojunction bipolar transistor (HBT). The semiconductor device includes the HBT, which is formed on a semiconductor substrate, and a bump for external coupling. An emitter electrode is coupled to the emitter of the HBT and wiring of the first layer is arranged over the emitter electrode. The bump is arranged over the wiring. An insulation film is arranged between the emitter electrode and the wiring of the first layer while an insulation film is arranged between the wiring of the first layer and the bump. The emitter electrode and the wiring of the first layer, and the wiring of the first layer and the bump are mutually coupled through openings provided in these insulation films.

SUMMARY

The semiconductor device disclosed in Japanese Unexamined Patent Application Publication No. 2003-77930 described above is face-down mounted over a mounting board for example. After the mounting, the semiconductor device undergoes resin sealing. In the mounting process of the semiconductor device, heating treatment, such as reflow treatment, is performed. In the heating treatment, thermal stress due to a difference in coefficient of linear expansion between the semiconductor portion and metal wiring of the semiconductor device occurs near an interface where the semiconductor portion and the metal wiring are in contact. The thermal stress can be added to the HBT and the HBT can be damaged accordingly. The difference in coefficient of linear expansion between the semiconductor portion and the metal wiring is not a unique factor that causes the thermal stress added to the semiconductor portion. The thermal stress caused by mutual differences in coefficient of linear expansion among the mounting board, the sealing resin, the bump material used for the face-down mounting, and the like propagates to the semiconductor portion. Thus, the present embodiments lessen thermal stress and provide a highly reliable semiconductor device.

According to preferred embodiments of the present disclosure, a semiconductor device includes at least one unit transistor arranged over a substrate; a first wiring that is arranged over the at least one unit transistor and serves as a path of current that flows to each of the at least one unit transistor; an inorganic insulation film that is arranged over the first wiring, is provided with at least one first opening overlapping a partial region of the first wiring in a plan view, and is formed from an inorganic insulation material; an organic insulation film that is arranged over the inorganic insulation film and is formed from an organic insulation material; and a second wiring that is arranged over the organic insulation film and the inorganic insulation film and is coupled to the first wiring through the first opening. In a plan view, a region in which the organic insulation film is not arranged is provided outside a region in which the first wiring is arranged, and the second wiring is in contact with the inorganic insulation film outside the region in which the first wiring is arranged.

According to preferred embodiments of the present disclosure, a high-frequency module includes the semiconductor device; and a mounting board over which the semiconductor device is mounted. The mounting board includes a land that is arranged in a position opposite the bump and is coupled to the bump, a conductor plate that is arranged in a position different from the position of the land in a thickness direction of the mounting board and partly overlaps the land in a plan view, and a via conductor that couples the land and the conductor plate. In a plan view, the bump and the via conductor partly overlap.

As a result of contact between the second wiring and the inorganic insulation film, the thermal stress caused by the difference in coefficient of linear expansion between the second wiring and the substrate is dispersed to the inorganic insulation film through the contact portion between the second wiring and the inorganic insulation film. Since the inorganic insulation film is deformed less easily than the organic insulation film, deformation of the second wiring due to thermal stress can be suppressed. When the deformation of the second wiring is suppressed, concentration of the thermal stress on the unit transistor can be lessened. Consequently, the reliability of the semiconductor device can be enhanced.

Other features, elements, characteristics and advantages of the present disclosure will become more apparent from the following detailed description of preferred embodiments of the present disclosure with reference to the attached drawings.

DETAILED DESCRIPTION

First Embodiment

Figure 1A:
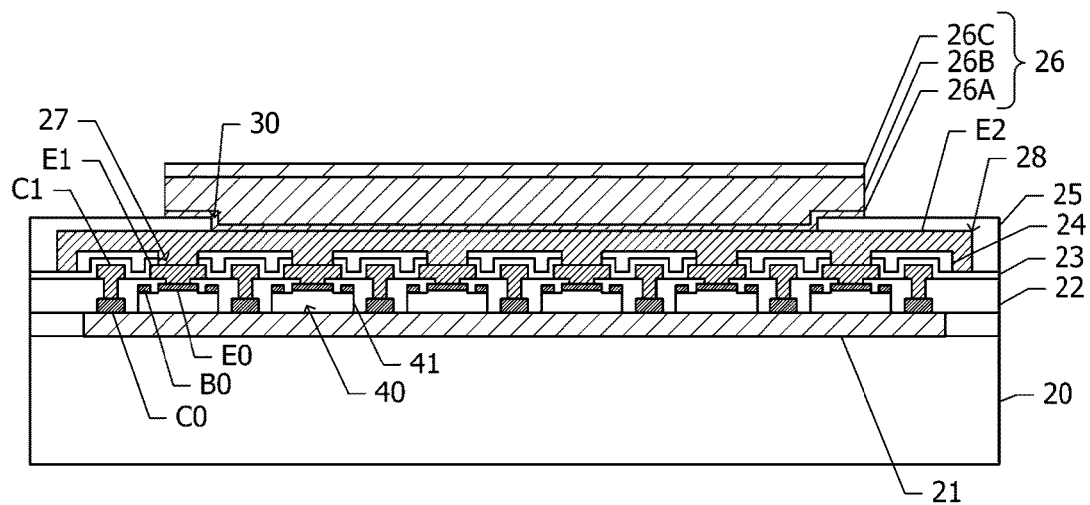
FIG. 1A is a cross-sectional view of a semiconductor device according to a first embodiment and FIG. 1B illustrates a positional relation among wiring patterns, insulation patterns, and the like that make up the semiconductor device according to the first embodiment in a plan view.
Figure 1B:
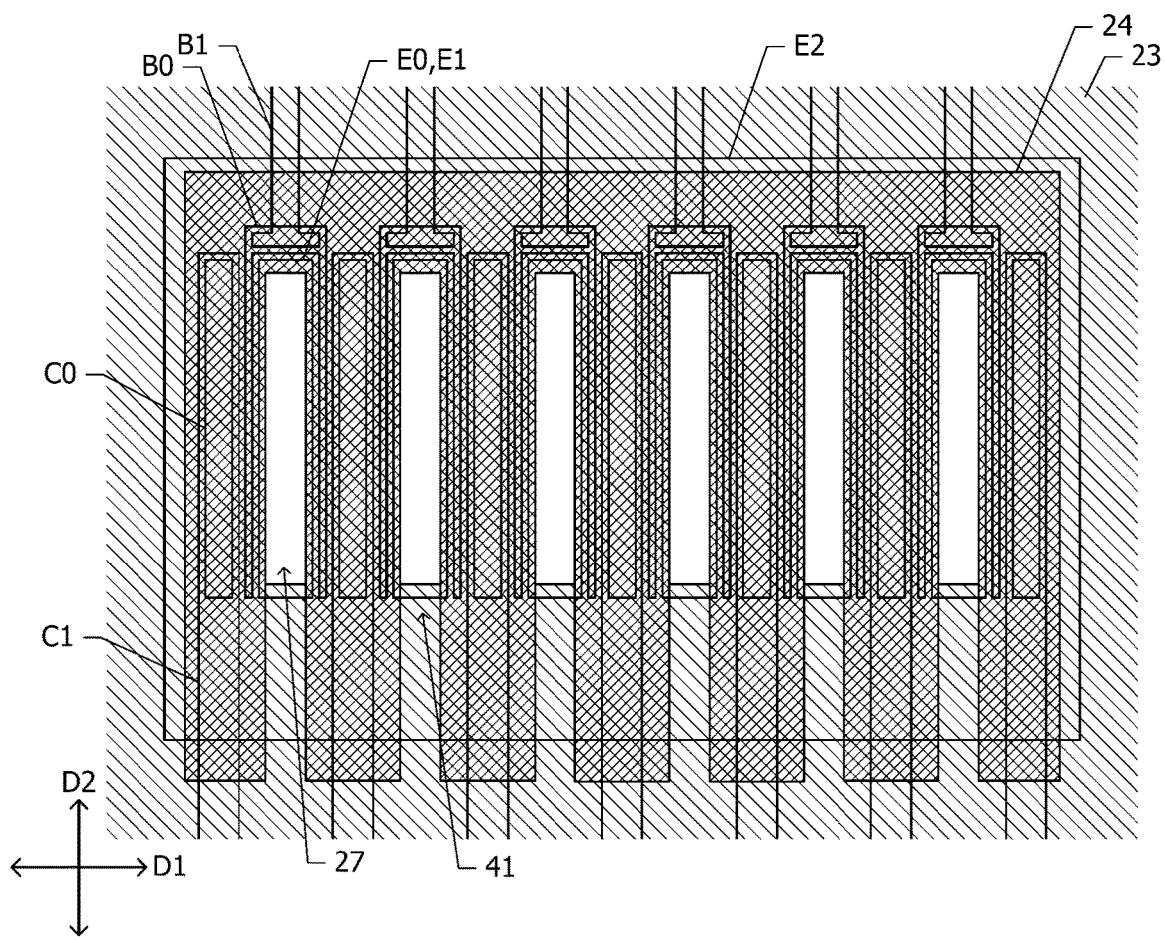

With reference to FIG. 1A and FIG. 1B, a semiconductor device according to a first embodiment is described.

FIG. 1A is a cross-sectional view of the semiconductor device according to the first embodiment. A sub-collector layer 21 having n-type conductivity is arranged in an outer surface portion of a substrate 20. A plurality of unit transistors 40, the number of which is six for example, are formed on the sub-collector layer 21. The plurality of unit transistors 40 are mutually coupled in parallel. Each of the unit transistors 40 is constituted by a mesa-like multilayer body 41, which is arranged on the sub-collector layer 21. The mesa-like multilayer body 41 includes a collector layer, a base layer, and an emitter layer, which are laminated in order from the side of the substrate. A pn junction interface between the base layer and the collector layer lies throughout the region of the mesa-like multilayer body 41 in a plan view while a pn junction interface between the emitter layer and the base layer lies in a partial region inside the mesa-like multilayer body 41 in a plan view.

An emitter electrode E0, a base electrode B0, and a collector electrode C0 are coupled to each of the plurality of unit transistors 40. In the cross section illustrated in FIG. 1A, that is, the cross section parallel to the direction in which the plurality of unit transistors 40 are aligned, the base electrode B0 is present on both sides of each emitter electrode E0. The emitter electrode E0 and the base electrode B0 are coupled to the emitter layer and the base layer of the unit transistors 40, respectively. The collector electrodes C0 are arranged on both sides of each mesa-like multilayer body 41 and coupled to the respective collector layers of the unit transistors 40 with the sub-collector layer 21 interposed therebetween. The collector electrode C0 arranged between two of the mesa-like multilayer bodies 41 adjacent to each other is shared by the unit transistors 40 on both sides thereof.

An insulation film 22 is arranged over the substrate 20 so as to cover the unit transistors 40, the emitter electrodes E0, the base electrodes B0, and the collector electrodes C0. An emitter wiring E1 (a first wiring) and a collector wiring C1 of the first layer are arranged over the insulation film 22. The emitter wiring E1 is arranged over the unit transistor 40 for each unit transistor 40 and coupled to the emitter electrode E0 through an opening provided in the insulation film 22. In a plan view, the collector wiring C1 of the first layer is arranged in a position that partly overlaps the collector electrode C0 and coupled to the collector electrode C0 through an opening provided in the insulation film 22. Herein, the expression that "two members partly overlap in a plan view" means that at least part of one member covers at least part of the other member. The emitter wiring E1 and the collector wiring C1 of the first layer serve as a path of current that flows to each of the unit transistors 40.

An inorganic insulation film 23 made from an inorganic insulation material is arranged over the insulation film 22 so as to cover the emitter wirings E1 and the collector wirings C1 of the first layer. A plurality of openings 27 are provided in the inorganic insulation film 23. The openings 27 are provided so as to correspond to the plurality of emitter wirings E1 of the first layer, and are each included in the corresponding emitter wiring E1 in a plan view.

An organic insulation film 24 made from an organic insulation material is arranged over a partial region of the inorganic insulation film 23. In a plan view, the organic insulation film 24 is arranged in a region that does not overlap the openings 27 provided in the inorganic insulation film 23 and in a plan view, regions in which the organic insulation film 24 is not arranged are secured outside the emitter wirings E1 of the first layer.

An emitter wiring E2 (a second wiring) of the second layer is arranged over the organic insulation film 24 and the inorganic insulation film 23. In a plan view, the plurality of emitter wirings E1 of the first layer are included in a single emitter wiring, which is the emitter wiring E2 of the second layer. The emitter wiring E2 of the second layer is coupled to the emitter wirings E1 of the first layer through the openings 27. Further, at least part of edges 28 of the emitter wiring E2 of the second layer extends to the outside of the organic insulation film 24 in a plan view, and is in contact with the inorganic insulation film 23 in the regions in which the organic insulation film 24 is not arranged.

In the conductor layer identical to the emitter wiring E2 of the second layer, in regions except the cross section illustrated in FIG. 1A, other wirings are also arranged, such as a collector wiring of the second layer coupled to the collector wiring C1 of the first layer, and the like.

A protection film 25 made from an insulation material is arranged over the inorganic insulation film 23 so as to cover the emitter wiring E2 of the second layer. A bump opening 30, which is included in the emitter wiring E2 of the second layer in a plan view, is provided in the protection film 25. Part of the upper surface of the emitter wiring E2 of the second layer is exposed in the bump opening 30. An emitter bump 26 is arranged over the emitter wiring E2 of the second layer exposed in the bump opening 30 and over a portion of the protection film 25 surrounding the bump opening 30.

The emitter bump 26 includes an under-bump metal layer 26A, a metal post 26B over the under-bump metal layer 26A, and a solder layer 26C that covers the upper surface of the metal post 26B. In addition to the emitter bump 26, other bumps are provided over the substrate 20.

FIG. 1B illustrates a positional relation among wiring patterns, insulation patterns, and the like that make up the semiconductor device according to the first embodiment in a plan view. In FIG. 1B, the inorganic insulation film 23 is given a hatch pattern drawn downward to the right, which is relatively low in density, while the organic insulation film 24 is given a hatch pattern drawn upward to the right, which is relatively high in density.

The plurality of emitter electrodes E0 are arranged in parallel in one direction. Hereinafter, the direction in which the plurality of emitter electrodes E0 are arranged is referred to as a first direction D1. The emitter wirings E1 of the first layer are arranged so as to approximately overlap the plurality of emitter electrodes E0. The emitter electrodes E0 and the emitter wirings E1 of the first layer each have a shape long in a direction perpendicular to the first direction D1, which is hereinafter referred to as a second direction D2.

The base electrode B0 that has an approximately U-like shape is arranged so as to surround each of the emitter electrodes E0 from three directions (in FIG. 1B, the left side, the right side, and the upper side). A base wiring B1 of the first layer is extended from a partial region of the base electrode B0 in the second direction D2 (in FIG. 1B, the direction toward the upper side).

The collector electrodes C0 are arranged between each two of the mesa-like multilayer bodies 41 (FIG. 1A) adjacent to each other, and further outside than the mesa-like multilayer bodies 41 in both end portions. Each of the collector electrodes C0 also has a shape long in the second direction D2. The collector wiring C1 is extended from the collector electrode C0 in the second direction D2 (in FIG. 1B, in the direction toward the lower side). The extended direction of the base wiring B1 and the extended direction of the collector wiring C1 are opposite each other.

The plurality of openings 27 are provided in the inorganic insulation film 23. The plurality of openings 27 are provided so as to correspond to the emitter wirings E1, and are each included in the emitter wiring E1 in a plan view. The organic insulation film 24 is arranged in part of the region in which the openings 27 are not arranged. The organic insulation film 24 has a substantially planar shape, which is approximately like comb teeth. The portions that correspond to the comb teeth of the organic insulation film 24 partly overlap the collector wirings C1 of the first layer and the portions that connect end portions of the plurality of comb teeth partly overlap the base wirings B1 of the first layer.

The emitter wiring E2 of the second layer includes the collector electrodes C0, the base electrodes B0, and the emitter electrodes E0. Further, the emitter wiring E2 of the second layer includes the plurality of mesa-like multilayer bodies 41. That is, the emitter wiring E2 of the second layer includes the pn junction interfaces between the collector layers and the base layers of the plurality of unit transistors 40. The emitter wiring E2 is approximately shaped like a rectangle that has longer sides parallel in the first direction D1. The edge 28 corresponding to one of the longer sides of the emitter wiring E2 crosses the portions of the comb teeth of the organic insulation film 24. The edges 28 corresponding to the other longer side and a pair of shorter sides of the emitter wiring E2 are positioned outside the organic insulation film 24. Among the edges 28 of the emitter wiring E2, the portions that do not overlap the organic insulation film 24 are in contact with the inorganic insulation film 23.

A forming method of the inorganic insulation film 23 and the organic insulation film 24 is described below. First, the inorganic insulation film 23 is formed by chemical vapor deposition (CVD), sputtering, or the like. After that, the openings 27 are formed by dry etching. After forming the openings 27, the organic insulation film 24, which is photocurable, is formed entirely by coating or the like. The organic insulation film 24 undergoes patterning by being exposed to light and developed. By performing curing after the patterning, the organic insulation film 24 is solidified.

Excellent effects of the first embodiment are described below.

In the heating process, such as reflow treatment, in mounting the semiconductor device on the mounting board, thermal stress is added to the mesa-like multilayer bodies 41 of the unit transistors 40 because of a difference in coefficient of linear expansion between the substrate 20 constituted by a semiconductor and the emitter wiring E2 of the second layer made from metal, such as Au. In a plan view, the emitter wiring E2 of the second layer includes the plurality of emitter wirings E1 of the first layer and occupies a region larger than the emitter wirings E1 of the first layer. Accordingly, the mesa-like multilayer bodies 41 are affected more largely by thermal stress from the emitter wiring E2 of the second layer than that from the emitter wirings E1 of the first layer. Since the Young's modulus of the organic insulation film 24 is smaller than the Young's modulus of the inorganic insulation film 23, the organic insulation film 24 can be deformed more easily than the inorganic insulation film 23. Thus, the emitter wiring E2 arranged over the organic insulation film 24 can thermally expand easily. As a result, stress can be concentrated on the unit transistors 40, easily.

Examples of a material used for the organic insulation film 24 can include resin, such as polyimide, benzocyclobutene (BCB), and the like. The Young's modulus of such resin is within a range from approximately 2 GPa to 4 GPa inclusive. Examples of a material used for the inorganic insulation film 23 can include silicon nitride (SiN), silicon oxide (SiO), silicon oxynitride (SiON), and the like. The Young's moduli of such inorganic materials vary, depending on the conditions in forming films. The Young's modulus of the SiN is approximately 200 GPa while the Young's modulus of the SiO is approximately 70 GPa. The Young's modulus of the SiON is between the Young's modulus of the SiN and the Young's modulus of the SiO. Thus, the Young's modulus of the resin used for the organic insulation film 24 is smaller than the Young's modulus of the inorganic material used for the inorganic insulation film 23 by one digit or more. The Young's moduli of such materials can be measured by an indentation method, a tensile testing method, a three-point bending testing method, or the like. The Young's modulus of Au as a material for the emitter wiring E2 of the second layer or the like is approximately 80 GPa and the Young's modulus of Cu used for a conductor plate 63 of an internal layer, a via conductor 64, lands 61 and 62, the metal post 26B, and the like is approximately 40 GPa. Thus, the inorganic insulation film 23 has the property of becoming deformed less easily than the organic insulation film 24 when stress is added.

In the first embodiment, part of the edges 28 of the emitter wiring E2 is in contact with the inorganic insulation film 23 deformed less easily than the organic insulation film 24 and thus, occurrence of deformation of the emitter wiring E2 can be hindered. In other words, thermal stress can be dispersed to the contact portions between the emitter wiring E2 and the inorganic insulation film 23 and thus, concentration of the stress on the mesa-like multilayer bodies 41 that constitute the unit transistors 40 can be reduced. Accordingly, destruction of the unit transistors 40 due to thermal stress can be suppressed.

Further, in the first embodiment, the organic insulation film 24 is also arranged between the collector wirings C1 of the first layer and the emitter wiring E2 of the second layer in addition to the inorganic insulation film 23. The film thickness of the organic insulation film 24 can be increased more easily than that of the inorganic insulation film 23. For example, if the inorganic insulation film 23 is thickened, falling off or crack can be caused by thermal stress easily. Thus, spacing between the collector wirings C1 of the first layer and the emitter wiring E2 of the second layer in the thickness direction can be increased easily. Accordingly, parasitic capacitance between the collector wirings C1 and the emitter wiring E2 can be reduced. Similarly, parasitic capacitance between the base wirings B1 of the first layer and the emitter wiring E2 of the second layer can be reduced.

In addition, resistance to moisture can be enhanced more by arranging the inorganic insulation film 23 over the emitter wirings E1 of the first layer, the collector wirings C1, and the base wirings B1 in comparison with a configuration in which only the organic insulation film 24 is arranged.

Further, in the mounting, thermal stress due to a difference in coefficient of linear expansion among the mounting board, the sealing resin, and the emitter bump 26, and the substrate 20 of the semiconductor is caused. This thermal stress is added to the unit transistors 40 through the emitter bump 26. In view of the thermal stress added to the unit transistors 40 through the emitter bump 26, it is preferable that, in a plan view, the area of the region in which the emitter bump 26 and the organic insulation film 24 overlap be relatively small in comparison with the area of the emitter bump 26. The thermal stress added to the unit transistors 40 through the emitter bump 26 is dispersed to the regions except the organic insulation film 24, that is, the regions in which the emitter wiring E2 and the inorganic insulation film 23 are in contact and thus, destruction of the unit transistors 40 can be suppressed.

For example, the coefficient of linear expansion of GaAs used for the substrate 20 is approximately 6 ppm/° C. The coefficient of linear expansion of Au used for the emitter wiring E2 of the second layer and the like is approximately 14 ppm/° C. The coefficient of linear expansion of polyimide that can be used for the organic insulation film 24 is approximately 50 ppm/° C. and the coefficient of linear expansion of BCB is approximately 42 ppm/° C. The coefficient of linear expansion of SiN that can be used for the inorganic insulation film 23 is approximately 3 ppm/° C. and the coefficient of linear expansion of SiO is approximately 0.5 ppm/° C. The coefficient of linear expansion of Cu used for the metal post 26B of the emitter bump 26 is approximately 16.5 ppm/° C. and the coefficient of linear expansion of solder used for the solder layer 26C is approximately 22 ppm/° C. When this semiconductor device is mounted over a mounting board, the coefficient of linear expansion of resin used for a typical mounting board is within a range from approximately 8 ppm/° C. to 20 ppm/° C. inclusive. The coefficient of linear expansion of sealing resin used when resin sealing is performed on the semiconductor device is within a range from approximately 10 ppm/° C. to 100 ppm/° C. inclusive. At temperatures higher than or equal to a glass transition temperature, a tendency is exhibited that the coefficient of linear expansion is large. The coefficients of linear expansion of these materials can be measured by a measurement method, such as thermomechanical analysis (TMA).

As a variation of the first embodiment, other insulation materials may be used for the inorganic insulation film 23 and the organic insulation film 24. By regarding the inorganic insulation film 23 and the organic insulation film 24 as a first insulation film and a second insulation film, respectively, the materials for the first insulation film and the second insulation film may be selected so that the Young's modulus of the first insulation film is higher than the Young's modulus of the second insulation film.

Second Embodiment

With reference to FIGS. 2 to 6, a semiconductor device 50 and a high-frequency module according to a second embodiment is described below. Hereinafter, the description of a configuration common to the semiconductor device according to the first embodiment is omitted.

Figure 2:
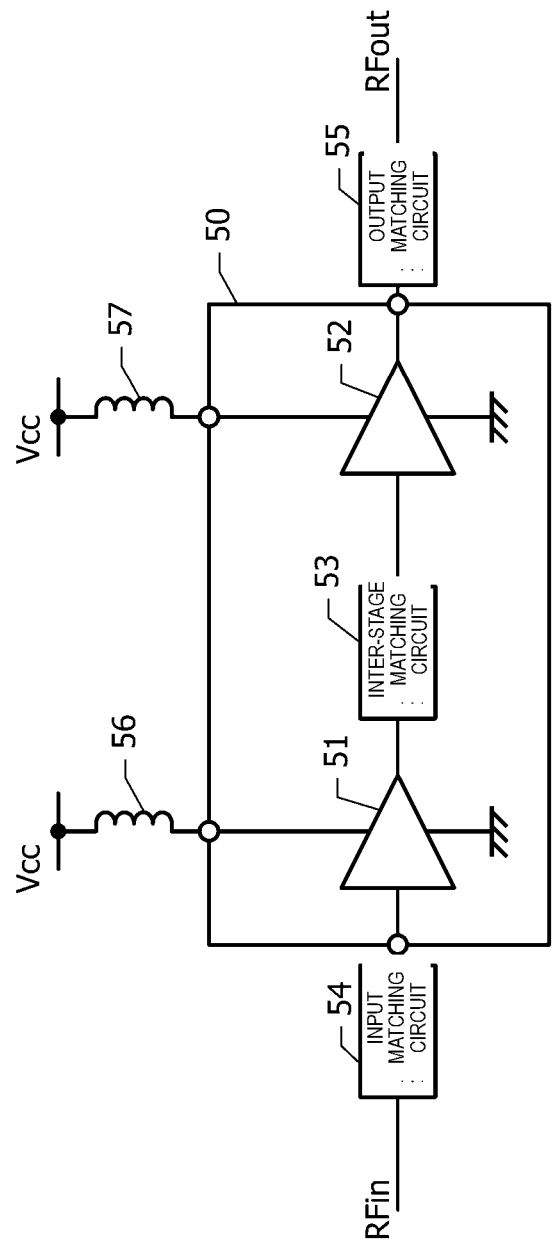
FIG. 2 is a block diagram of a high-frequency module in which a semiconductor device according to a second embodiment is used.

FIG. 2 is a block diagram of the high-frequency module in which the semiconductor device 50 according to the second embodiment is used. The high-frequency module includes a driver-stage amplification circuit 51, an output-stage amplification circuit 52, an inter-stage matching circuit 53, an input matching circuit 54, an output matching circuit 55, and inductors 56 and 57. The driver-stage amplification circuit 51, the output-stage amplification circuit 52, the inter-stage matching circuit 53, and the like are integrated in the semiconductor device 50. A bias circuit is not illustrated in FIG. 2. Supply voltage Vcc is supplied to the driver-stage amplification circuit 51 and the output-stage amplification circuit 52 through the inductors 56 and 57, respectively. The input matching circuit 54, the output matching circuit 55, and the inductors 56 and 57 are mounted over a module board together with the semiconductor device 50.

The driver-stage amplification circuit 51 and the output-stage amplification circuit 52 each include a plurality of unit transistors that are mutually coupled in parallel. An input signal RFin is input to the driver-stage amplification circuit 51 through the input matching circuit 54. The signal amplified in the driver-stage amplification circuit 51 is input to the output-stage amplification circuit 52 through the inter-stage matching circuit 53. The signal amplified in the output-stage amplification circuit 52 is output as an output signal RFout through the output matching circuit 55.

Figure 3:
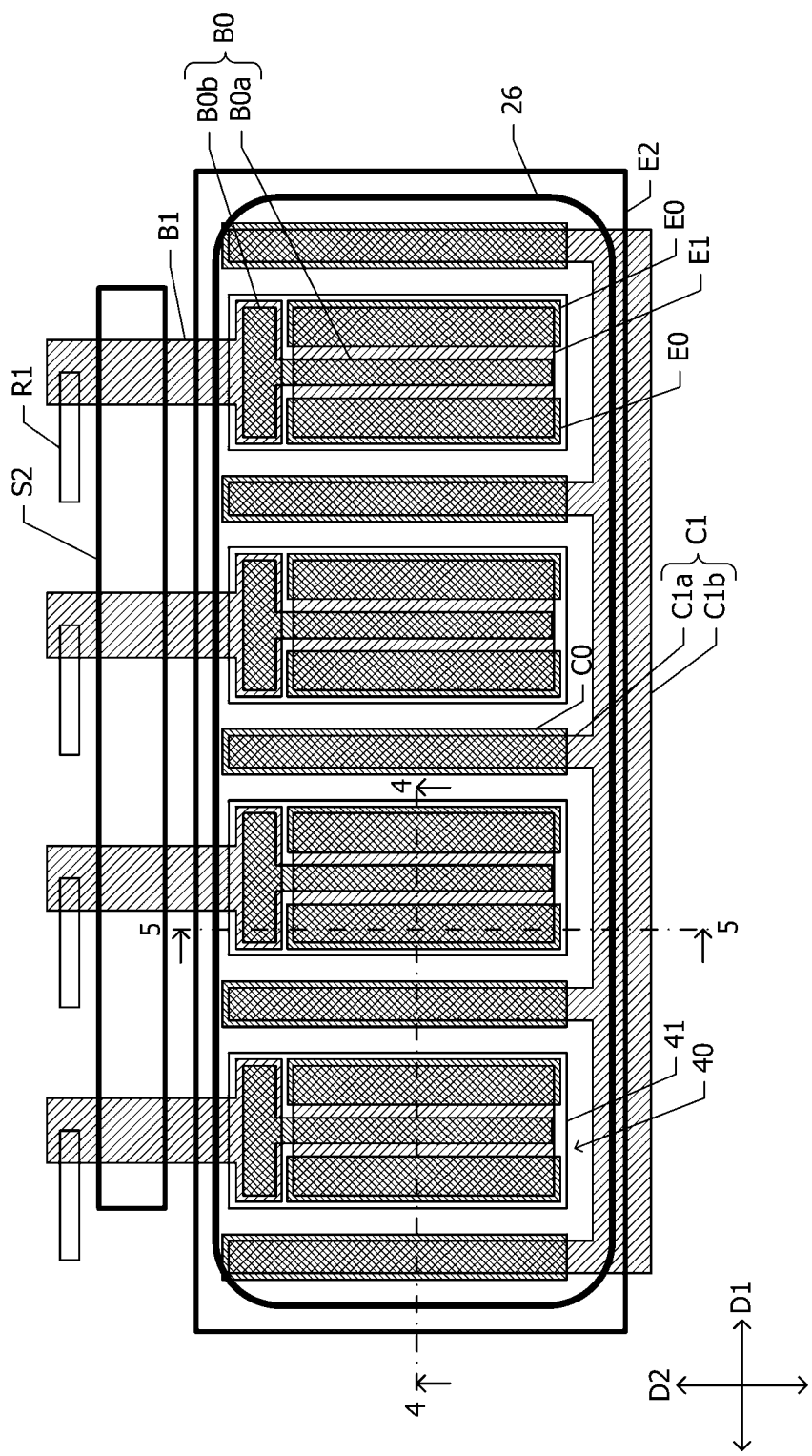
FIG. 3 illustrates arrangement of components of an output-stage amplification circuit in the semiconductor device according to the second embodiment in a plan view.

FIG. 3 illustrates arrangement of components of the output-stage amplification circuit 52 in the semiconductor device 50 according to the second embodiment (FIG. 2) in a plan view. The driver-stage amplification circuit 51 also has a configuration substantially similar to that of the output-stage amplification circuit 52. In FIG. 3, an emitter electrode E0, a collector electrode C0, and a base electrode B0 are each given a hatch pattern drawn upward to the right, which is relatively high in density, while an emitter wiring E1 of the first layer, a collector wiring C1, and a base wiring B1 are each given a hatch pattern drawn downward to the right, which is relatively low in density.

Similar to the semiconductor device according to the first embodiment (FIG. 1B), a plurality of unit transistors 40 are arranged in parallel in a first direction D1. The collector electrodes C0 are arranged on both sides of each of the unit transistors 40 in the first direction D1. One of the collector electrodes C0 is arranged between two of the unit transistors 40 adjacent to each other in the first direction D1 and shared by the unit transistors 40 on both sides thereof.

In a plan view, the emitter electrodes E0 and the base electrode B0 are positioned in a mesa-like multilayer body 41 that constitutes each unit transistor 40. In the semiconductor device according to the first embodiment (FIG. 1B), each base electrode B0 surrounds the corresponding emitter electrode E0 on three sides thereof. In contrast, in the second embodiment, the two emitter electrodes E0 are arranged in parallel in the first direction D1. Each of the emitter electrodes E0 has an approximately planar shape long in a second direction D2. A base electrode main portion B0a is arranged between the two emitter electrodes E0. The base electrode main portion B0a also has an approximately planar shape long in the second direction D2. A base electrode coupling portion B0b extends from one end portion of the base electrode main portion B0a toward both sides of the first direction D1. The base electrode B0 is constituted of the base electrode main portion B0a and the base electrode coupling portion B0b, and has an approximately T-like planar shape.

The emitter wiring E1 of the first layer is arranged from one of the emitter electrodes E0 of each unit transistor 40 to the other emitter electrode E0 across the base electrode main portion B0a. The collector wiring C1 of the first layer includes a plurality of collector extended wirings C1a and a collector common wiring C1b that couples the plurality of collector extended wirings C1a. Each collector extended wiring C1a is extended from the plurality of collector electrodes C0 toward one side of the second direction D2 (in FIG. 3, the lower side). The collector common wiring C1b is arranged opposite the side on which the base electrode coupling portion B0b is arranged when viewed from the emitter wiring E1.

The plurality of base wirings B1 of the first layer are each extended from the base electrode coupling portion B0b toward the other side of the second direction D2 (in FIG. 3, the upper side). The plurality of base wirings B1 are each coupled to a ballast resistive element R1. Base bias current is supplied to the unit transistor 40 through the ballast resistive element R1. Further, the plurality of base wirings B1 of the first layer cross a single input wiring S2 arranged in a conductor layer of the second layer. A portion in which the base wiring B1 and the input wiring S2 cross functions as an input capacitative element. A high-frequency signal is input to the unit transistor 40 through the input wiring S2 and the input capacitative element.

An emitter wiring E2 of the second layer is arranged so as to include the plurality of emitter wirings E1 in a plan view. An emitter bump 26 is arranged so as to overlap at least part of the emitter wiring E2 of the second layer.

Figure 4:
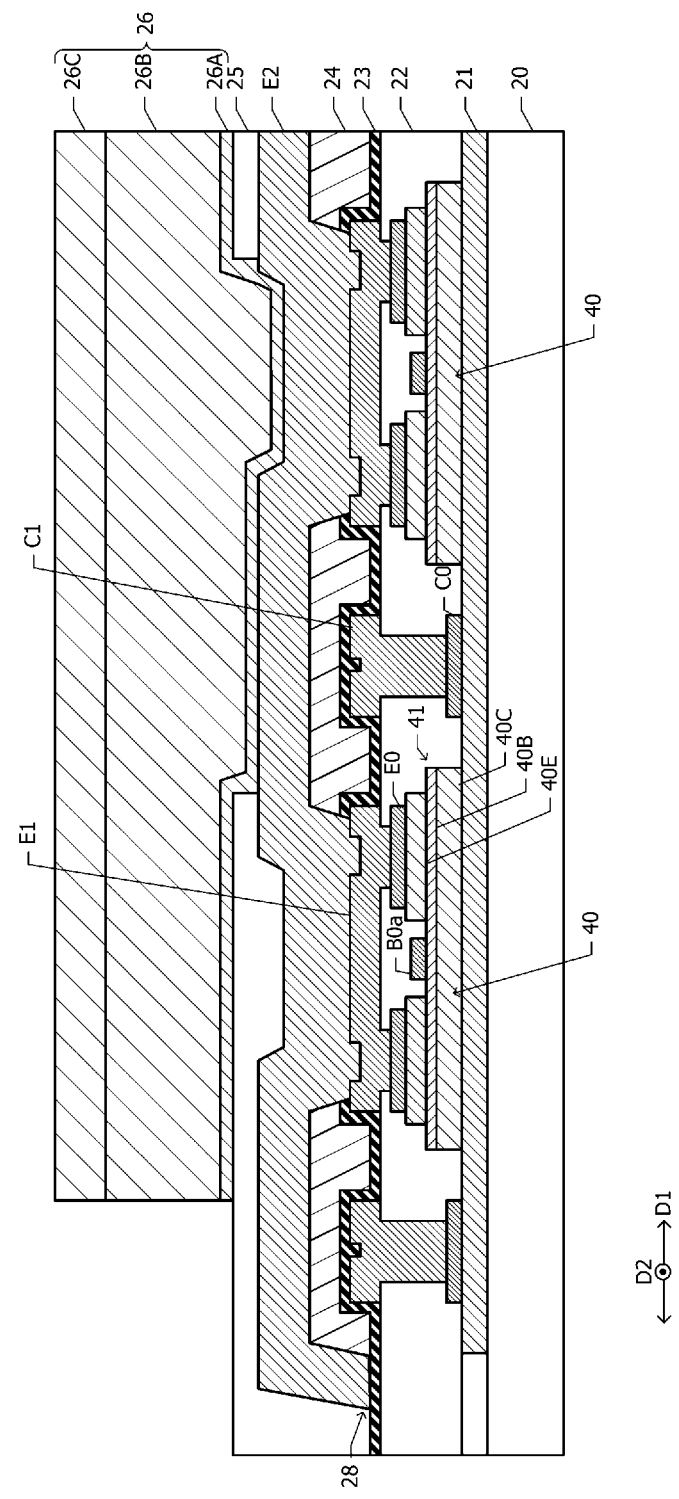
FIG. 4 is a cross-sectional view along alternate long and short dash lines 4-4 in FIG. 3.

FIG. 4 is a cross-sectional view along alternate long and short dash lines 4-4 in FIG. 3. Similar to the semiconductor device according to the first embodiment (FIG. 1A), a sub-collector layer 21 is arranged on part of the outer surface portion of a substrate 20. The mesa-like multilayer bodies 41 that constitute the plurality of unit transistors 40 are arranged over the sub-collector layer 21. The mesa-like multilayer body 41 includes a collector layer 40C, a base layer 40B, and two emitter layers 40E in order from the side of the substrate. In a plan view, the collector layer 40C and the base layer 40B lie throughout the region of the mesa-like multilayer body 41. Thus, in a plan view, a pn junction interface between the collector layer and the base layer agrees with the mesa-like multilayer body 41. In a plan view, the mesa-like multilayer body 41 and the pn junction interface between the collector layer and the base layer each have a shape long in the second direction D2. The two emitter layers 40E are arranged on the upper surface of the base layer 40B while spaced in the first direction D1. In a plan view, the pn junction interfaces between the emitter layers and the base layer are included in the mesa-like multilayer body 41.

The emitter electrodes E0 are arranged over the emitter layer 40E. The base electrode main portion B0a is arranged in a region between the two emitter layers 40E, which is included in the upper surface of the base layer 40B.

An insulation film 22 is arranged over the substrate 20 so as to cover the mesa-like multilayer bodies 41, the collector electrodes C0, the base electrodes B0, and the emitter electrodes E0. The emitter wirings E1 and the collector wirings C1 of the first layer are arranged over the insulation film 22. The emitter wiring E1 is arranged for each unit transistor 40 and coupled to the two emitter electrodes E0 through openings provided in the insulation film 22. The collector wiring C1 is coupled to the collector electrode C0 through an opening provided in the insulation film 22.

The configuration above the emitter wirings E1 and the collector wirings C1 of the first layer is identical to the configuration in the semiconductor device according to the first embodiment (FIG. 1A). Also in the second embodiment, an edge 28 of the emitter wiring E2 of the second layer is in contact with an inorganic insulation film 23.

Figure 5:
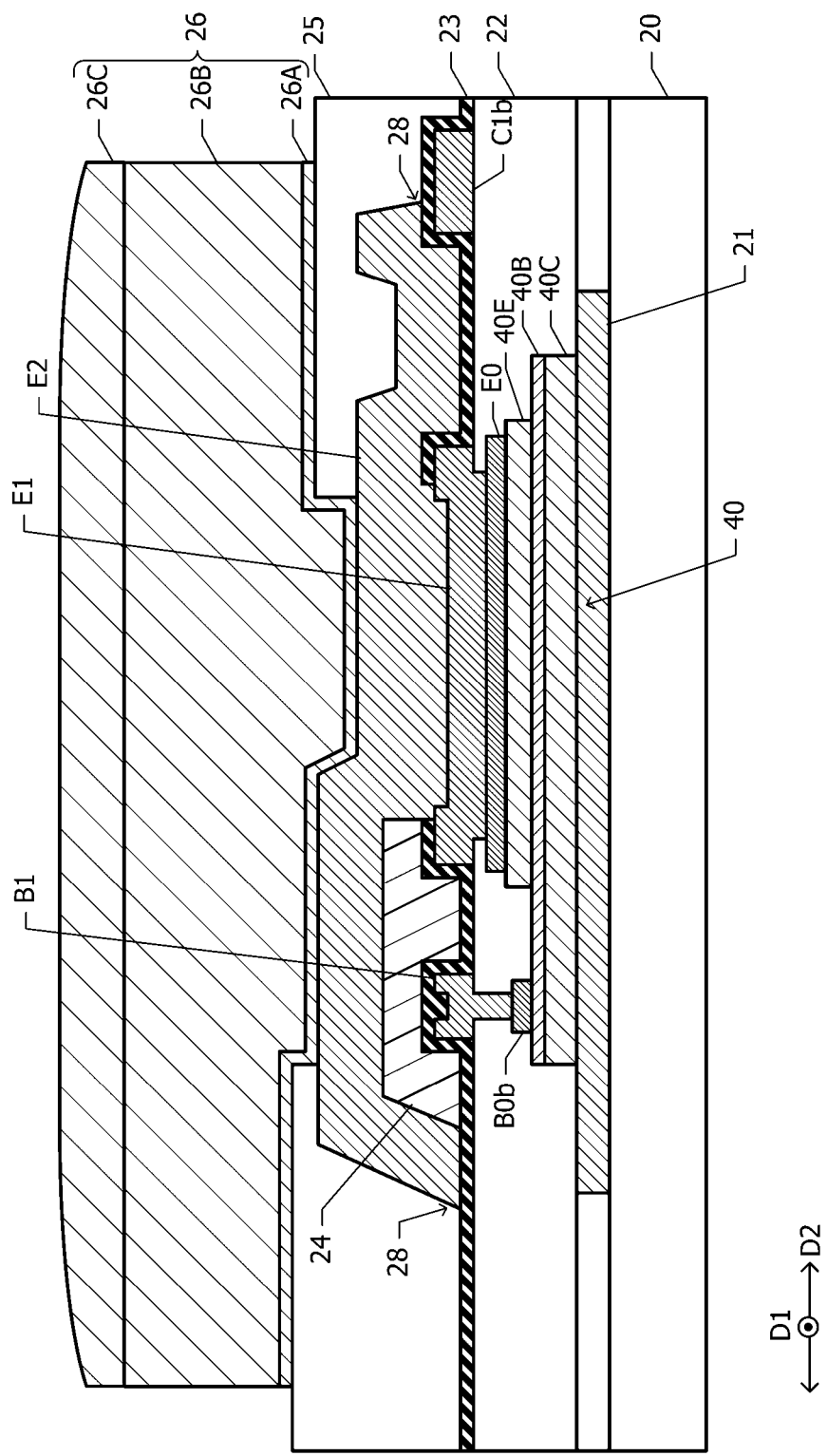
FIG. 5 is a cross-sectional view along alternate long and short dash lines 5-5 in FIG. 3.

FIG. 5 is a cross-sectional view along alternate long and short dash lines 5-5 in FIG. 3. Hereinafter, the description of the configuration that appears in the cross-sectional view illustrated in FIG. 4 is omitted. The base electrode coupling portion B0b is arranged on the upper surface of the base layer 40B while distanced from the emitter layer 40E in the second direction D2. The base wiring B1 of the first layer is arranged in a region that is included in the upper surface of the insulation film 22 and overlaps the base electrode coupling portion B0b in a plan view. The base wiring B1 of the first layer is coupled to the base electrode coupling portion B0b through an opening provided in the insulation film 22.

A collector common wiring C1b of the first layer is arranged in a region that is included in the upper surface of the insulation film 22 and is on the opposite side of the base electrode coupling portion B0b when viewed from the emitter wiring E1 of the first layer. Also in the cross section illustrated in FIG. 5, the edge 28 of the emitter wiring E2 of the second layer is in contact with the inorganic insulation film 23.

As the substrate 20, for example, a semi-insulative GaAs substrate is used. As the sub-collector layer 21, an n-type GaAs layer obtained through epitaxial growth over the substrate 20 is used. A high-resistance element isolation region is formed through ion implantation of proton or the like into a partial region of the n-type GaAs layer. For example, the collector layer 40C is formed from n-type GaAs, the base layer 40B is formed from p-type GaAs, and the emitter layers 40E is formed from n-type InGaP. The emitter layer 40E may be caused to have a three-layer configuration of an n-type InGaP layer, an n-type GaAs layer, and an n-type InGaAs layer.

Figure 6:
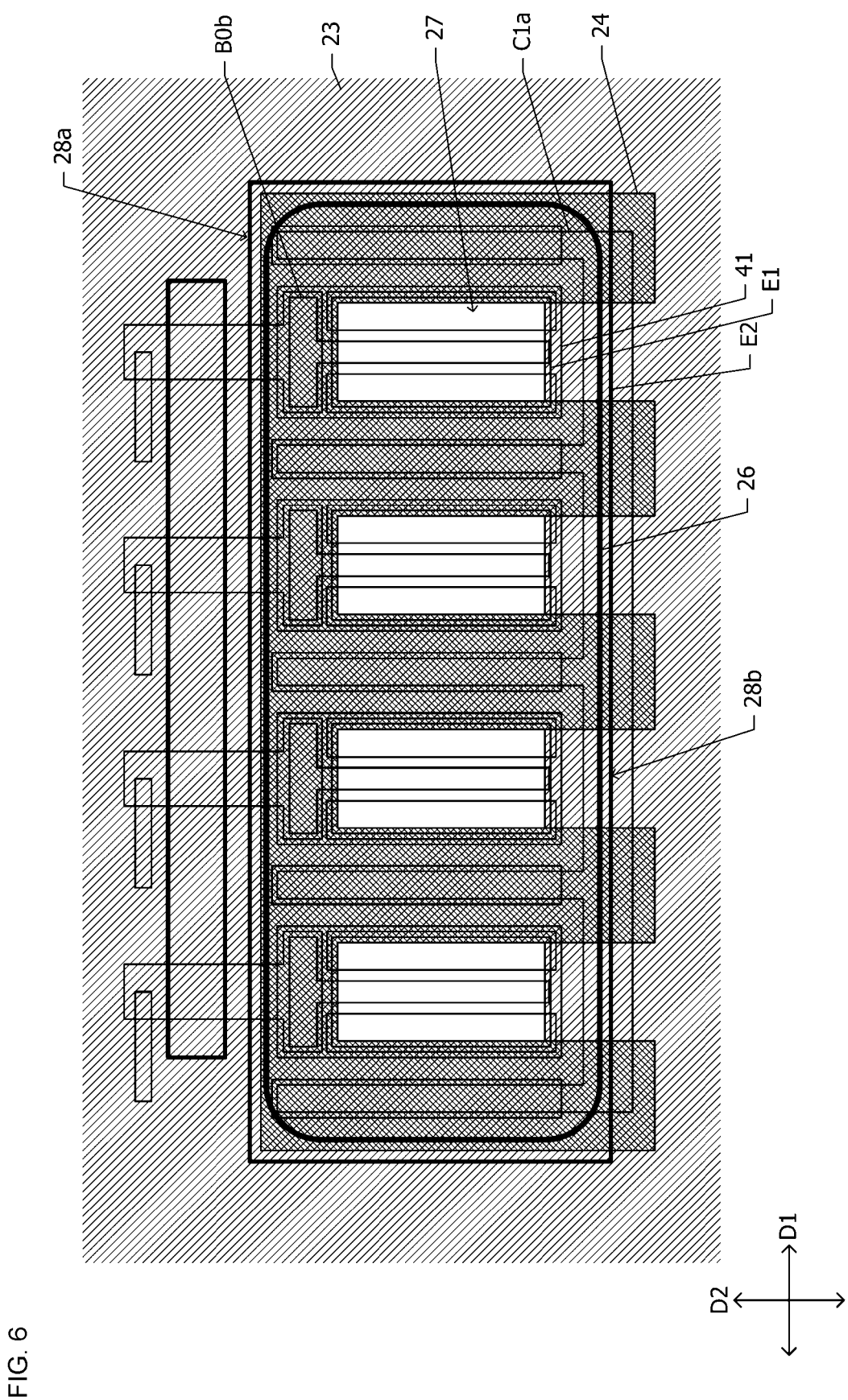
FIG. 6 illustrates a positional relation between an inorganic insulation film and an organic insulation film, and other components according to the second embodiment in a plan view.

FIG. 6 illustrates a positional relation between the inorganic insulation film 23 and an organic insulation film 24, and other components in a plan view. In FIG. 6, the inorganic insulation film 23 is given a hatch pattern drawn downward to the right, which is relatively low in density, while the organic insulation film 24 is given a hatch pattern drawn upward to the right, which is relatively high in density.

A plurality of openings 27 are provided in the inorganic insulation film 23. Each of the plurality of openings 27 is included in corresponding one of the plurality of emitter wirings E1 of the first layer. The organic insulation film 24 has an approximately planar shape like comb teeth. In a plan view, a portion that corresponds to the comb teeth of the organic insulation film 24 includes a collector extended wiring C1a. In a plan view, a portion that couples the comb teeth adjacent to each other includes the base electrode coupling portion B0b. The openings 27 provided in the inorganic insulation film 23 are positioned among the portions corresponding to the comb teeth of the organic insulation film 24.

The emitter wiring E2 of the second layer has an approximately planar shape long in the first direction D1 and includes the plurality of mesa-like multilayer bodies 41. That is, the emitter wiring E2 includes the pn junction interfaces of the plurality of unit transistors 40 in a plan view. One of a pair of edges corresponding to the longer sides, which is an edge 28a, is positioned outside the organic insulation film 24 throughout its length and is in contact with the inorganic insulation film 23. The other one of the edges corresponding to the longer sides, which is an edge 28b, extends across the portions corresponding to the comb teeth of the organic insulation film 24 and is in contact with the inorganic insulation film 23 among the portions corresponding to the comb teeth. That is, a plurality of portions that are in contact with the inorganic insulation film 23 are provided while spaced uniformly in the first direction D1. Further, regions in which the organic insulation film 24 is not arranged are provided in inside regions of the emitter wiring E2 of the second layer so as to correspond to the openings 27. Each of the regions in which the organic insulation film 24 is not arranged has an approximately planar shape long in the second direction D2.

Excellent effects of the second embodiment are described below.

Also in the second embodiment, part of the edges of the emitter wiring E2 of the second layer is in contact with the inorganic insulation film 23 and thus, similar to the first embodiment, destruction of the unit transistor 40 due to thermal stress can be suppressed.

Further, as illustrated in FIG. 4, the organic insulation film 24 is arranged between the collector wirings C1 of the first layer and the emitter wiring E2 of the second layer in the thickness direction in addition to the inorganic insulation film 23 and thus, parasitic capacitance between the collector wiring C1 and the emitter wiring E2 can be reduced. Similarly, as illustrated in FIG. 5, the organic insulation film 24 is arranged between the base wiring B1 over the base electrode coupling portion B0b and the emitter wiring E2 in addition to the inorganic insulation film 23 and thus, parasitic capacitance between the base wirings B1 and the emitter wiring E2 can be reduced.

Further, as illustrated in FIG. 4, in the primary surface of the emitter wiring E2 of the second layer, a difference in height between a region in the opening 27 provided in the inorganic insulation film 23 and the upper surface of the organic insulation film 24 is larger in comparison with a configuration in which the organic insulation film 24 is not arranged. Thus, waviness in the first direction D1, which reflects projections and depressions of the primary surface, is caused in the upper surface of the emitter wiring E2 of the second layer. Stress caused on the interface between the emitter wiring E1 of the first layer and the emitter wiring E2 of the second layer when the emitter wiring E2 elongates in the first direction D1 by heating can be lessened by the waviness. Accordingly, destruction of the unit transistor 40 due to thermal stress can be suppressed.

Coplanarity of the upper surfaces of a plurality of bumps is described below. A bump for input and output of a high-frequency signal, a bump for a control signal, a bump for grounding, and the like are provided over the substrate 20 in addition to the emitter bump 26. To suppress decrease in yield in the mounting process, it is preferable to enhance the coplanarity of the upper surfaces of the plurality of bumps. Since part of the emitter bump 26 is positioned over the organic insulation film 24, the upper surface of the emitter bump 26 exhibits a tendency of being higher than the upper surface of a bump in a region in which the organic insulation film 24 is not provided. To make a difference in height between the upper surface of the emitter bump 26 and the upper surface and the other bump small, it is preferable that, in a plan view, the area of the region in which the emitter bump 26 and the organic insulation film 24 overlap be less than 50% of the area of the emitter bump 26.

The present inventors have made a plurality of semiconductor devices different in area of the region in which the emitter bump 26 and the organic insulation film 24 overlap in a plan view and performed evaluation experiments of mounting the semiconductor devices over mounting boards. As a result, in a case of a sample in which the area of the region in which the emitter bump 26 and the organic insulation film 24 overlap is 50% or more of the area of the emitter bump 26 in a plan view, a defect that was caused by thermal stress in the mounting and destroyed the unit transistor 40 occurred. It was found that, also in view of thermal stress, the area of the region in which the emitter bump 26 and the organic insulation film 24 overlap in a plan view is desired to be less than 50% of the area of the emitter bump 26.

Figure 7:
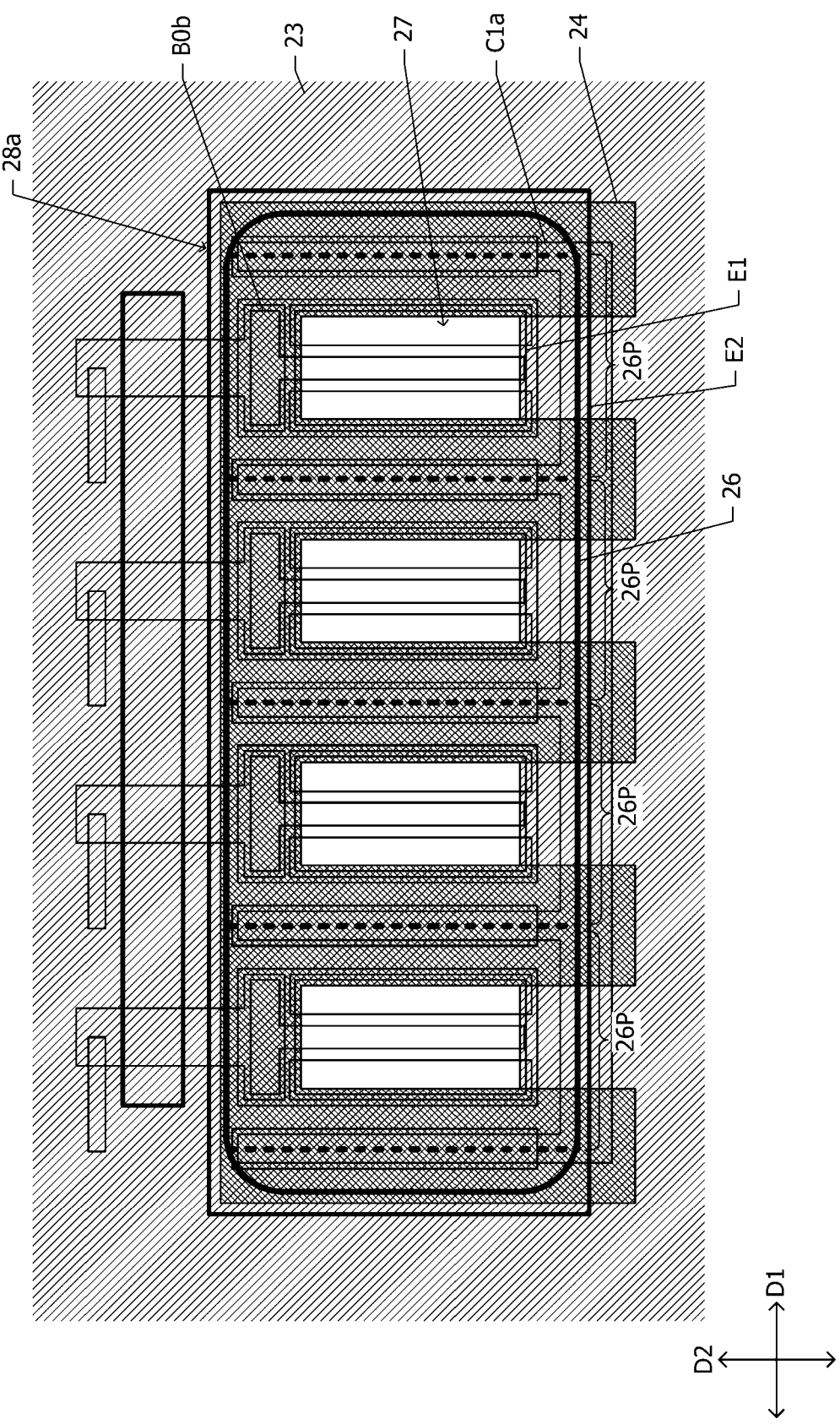
FIG. 7 illustrates a positional relation between the inorganic insulation film and the organic insulation film, and other components according to a first variation of the second embodiment in a plan view.

With reference to FIG. 7, a first variation of the second embodiment is described below.

FIG. 7 illustrates a positional relation between the inorganic insulation film 23 and the organic insulation film 24, and other components according to the first variation of the second embodiment in a plan view. Also in FIG. 7, similar to FIG. 6, the inorganic insulation film 23 is given a hatch pattern drawn downward to the right, which is relatively low in density, while the organic insulation film 24 is given a hatch pattern drawn upward to the right, which is relatively high in density.

In the second embodiment, the relation between the area of the region in which the overall emitter bump 26 and the organic insulation film 24 overlap in a plan view and the area of the overall emitter bump 26 is described. In the first variation of the second embodiment illustrated in FIG. 7, in each region corresponding to the unit transistor 40, the area of the region in which the emitter bump 26 and the organic insulation film 24 overlap in a plan view is less than 50% of the area of the emitter bump 26.

For example, the emitter bump 26 is divided in the first direction D1 on the basis of the array pitches of the unit transistors 40 and a unit bump section 26P corresponding to each of the unit transistors 40 is defined. A measurement of each of the unit bump sections 26P in the first direction D1 is equal to the array pitch of the plurality of unit transistors 40 in the first direction D1. In a plan view, the positions in the first direction D1 between the geometrical center of the unit transistor 40 and the geometrical center of the unit bump section 26P agree with each other. The geometrical center of the unit transistor 40 in a plan view can be regarded as the geometrical center of the collector-base junction interface of the unit transistor 40. In a plan view, the area of the region in which one of the unit bump sections 26P and the organic insulation film 24 overlap is less than 50% of the area of the unit bump section 26P.

When the plurality of unit transistors 40 are aligned with regular pitches, as in the first variation of the second embodiment, the area of the region in which one of the unit bump sections 26P and the organic insulation film 24 overlap in a plan view is desired to be less than 50% of the area of the unit bump section 26P. Also in the first variation of the second embodiment, similar to the second embodiment, an excellent effect of suppressing destruction of the unit transistor 40 caused by thermal stress in the mounting can be obtained.

Figure 8:
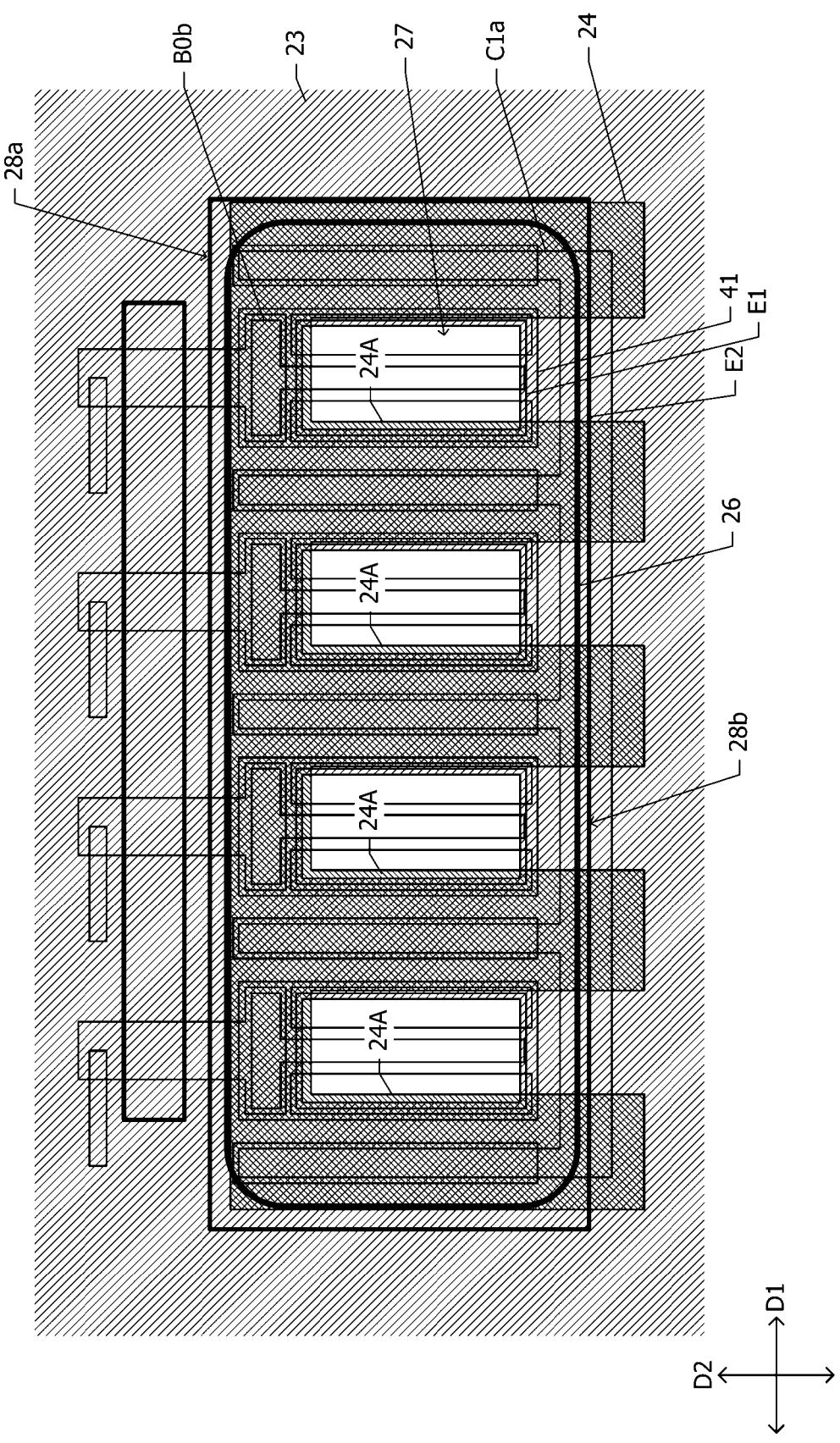
FIG. 8 illustrates a positional relation between the inorganic insulation film and the organic insulation film, and other components according to a second variation of the second embodiment in a plan view.

With reference to FIG. 8, a second variation of the second embodiment is described below.

FIG. 8 illustrates a positional relation between the inorganic insulation film 23 and the organic insulation film 24, and other components according to the second variation of the second embodiment in a plan view. Also in FIG. 8, similar to FIG. 6, the inorganic insulation film 23 is given a hatch pattern drawn downward to the right, which is relatively low in density, while the organic insulation film 24 is given a hatch pattern drawn upward to the right, which is relatively high in density.

In the second embodiment, in a plan view, the organic insulation film 24 is included in the inorganic insulation film 23. In contrast, in the second variation of the second embodiment, the organic insulation film 24 is present in part of the region in which the inorganic insulation film 23 is not arranged. Specifically, a portion 24A that is included in the organic insulation film 24 and does not overlap the inorganic insulation film 23 is provided in the opening 27. In the second variation of the second embodiment, in the region that is included in the opening 27 and in which the organic insulation film 24 is not arranged, the emitter wiring E1 of the first layer and the emitter wiring E2 of the second layer are coupled to each other. The portion 24A that is included in the organic insulation film 24 and does not overlap the inorganic insulation film 23 is in contact with the emitter wiring E1 of the first layer.

In particular, if the organic insulation film 24 is thickened so as to decrease inter-wiring parasitic capacitance, the accuracy of alignment and the accuracy of finishing of the organic insulation film 24 can be decreased easily. With lack of accuracy of alignment or finishing, the portion 24A that is included in the organic insulation film 24 and does not overlap the inorganic insulation film 23, illustrated in FIG. 8, can be caused. If the area of the portion 24A that is included in the organic insulation film 24 and does not overlap the inorganic insulation film 23, illustrated in FIG. 8, is sufficiently small in comparison with the area of the opening 27, such positional deviation is allowed. In other words, if such positional deviation is allowed, the organic insulation film 24 can be thickened further. As a result, inter-wiring parasitic capacitance can be reduced further.

Still another variation of the second embodiment is presented.

Although GaAs/InGaP-based HBTs are used in the second embodiment and the first and second variations thereof, other compound semiconductors may also be employed.

Third Embodiment

Figure 9:
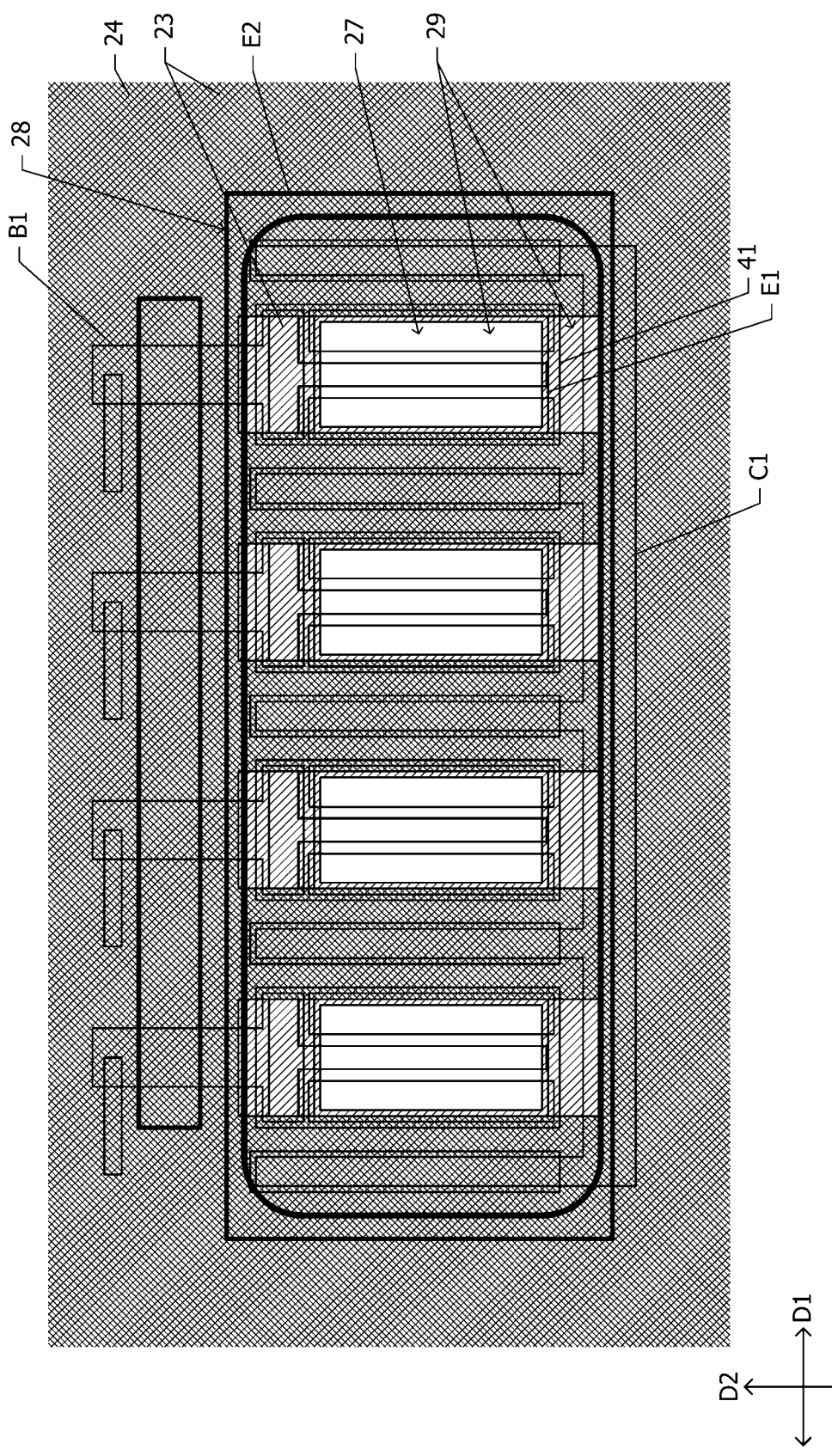
FIG. 9 illustrates a positional relation between an inorganic insulation film and an organic insulation film, and other components according to a third embodiment in a plan view.

With reference to FIG. 9, a semiconductor device according to a third embodiment is described below. Hereinafter, the description of a configuration common to the semiconductor device according to the second embodiment (FIGS. 3 to 6) is omitted.

FIG. 9 illustrates a positional relation between an inorganic insulation film 23 and an organic insulation film 24, and other components according to the third embodiment in a plan view. In FIG. 9, the inorganic insulation film 23 is given a hatch pattern drawn downward to the right, which is relatively low in density, while the organic insulation film 24 is given a hatch pattern drawn upward to the right, which is relatively high in density.

In the third embodiment, openings 29 that include openings 27 in the inorganic insulation film 23 in a plan view are provided in the organic insulation film 24. In FIG. 9, the regions with no hatch patterns correspond to the openings 27 and the regions with no hatch patterns or only with hatch patterns drawn downward to the right, which are relatively low in density, correspond to the openings 29. The openings 29 extend to outer side portions of the mesa-like multilayer bodies 41 in a plan view.

An emitter wiring E2 of the second layer is coupled to an emitter wiring E1 of the first layer in the opening 27. In the regions inside the openings 29 and outside the openings 27, the emitter wiring E2 of the second layer is in contact with the inorganic insulation film 23. An edge 28 of the emitter wiring E2 of the second layer overlaps the organic insulation film 24 throughout its length.

Excellent effects of the third embodiment are described below.

Also in the third embodiment, similar to the second embodiment, in an outer side portion of the emitter wiring E1 of the first layer, the emitter wiring E2 of the second layer is in contact with the inorganic insulation film 23 in a plan view. The contact region extends to the outside of the mesa-like multilayer bodies 41. Thus, concentration of thermal stress on the mesa-like multilayer bodies 41 can be lessened. As a result, destruction of the unit transistor 40 due to thermal stress can be suppressed.

In the third embodiment, the area of the region in which the collector wiring C1 of the first layer and the emitter wiring E2 of the second layer overlap in a plan view, and the area of the region in which the base wiring B1 of the first layer and the emitter wiring E2 of the second layer overlap are larger than those in the second embodiment. Thus, parasitic capacitance between the collector wiring C1 and the emitter wiring E2 and parasitic capacitance between the base wirings B1 and the emitter wiring E2 can be reduced further in comparison with the second embodiment.

Fourth Embodiment

Figure 10:
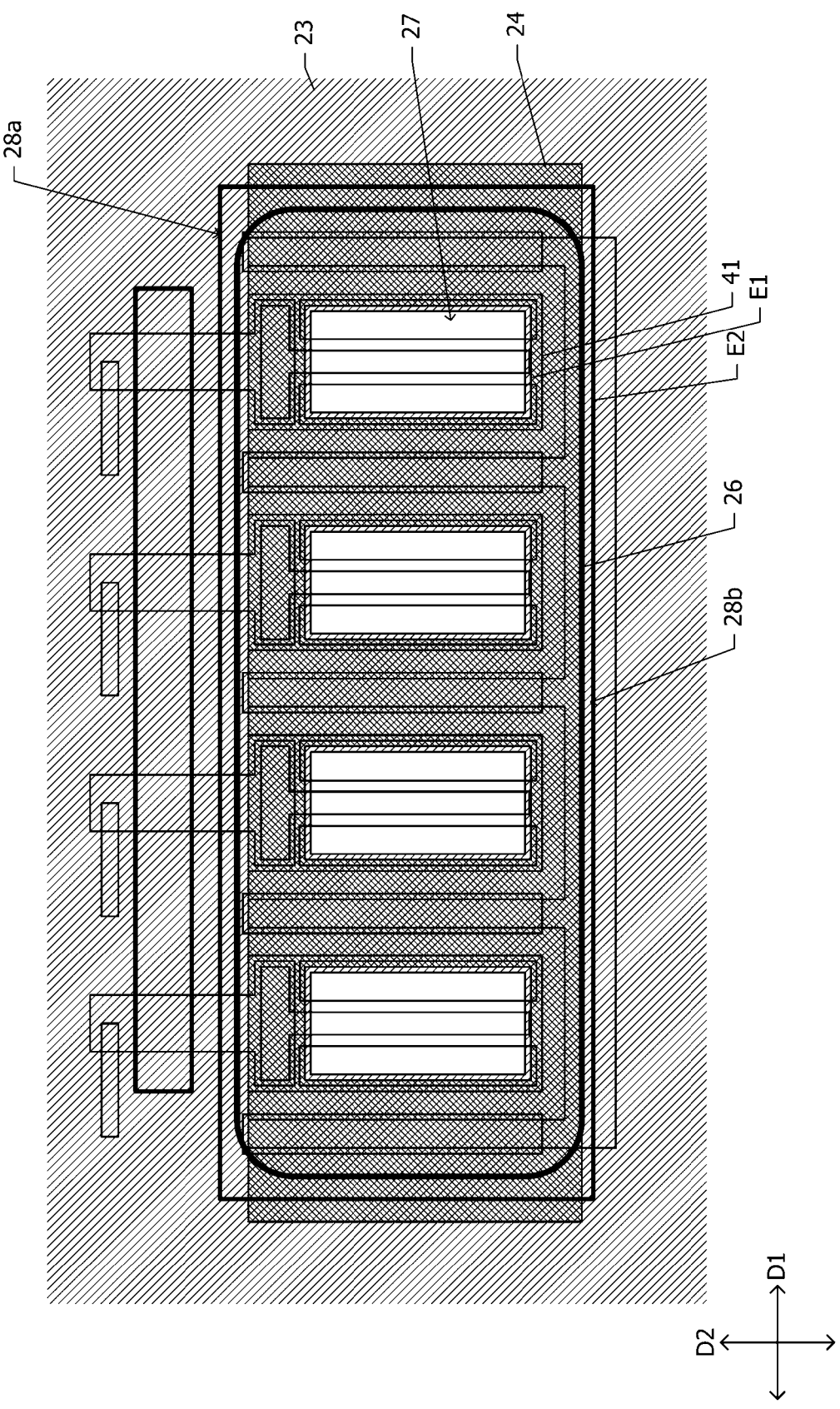
FIG. 10 illustrates a positional relation between an inorganic insulation film and an organic insulation film, and other components according to a fourth embodiment in a plan view.

With reference to FIG. 10, a semiconductor device according to a fourth embodiment is described below. Hereinafter, the description of a configuration common to the semiconductor device according to the second embodiment (FIGS. 3 to 6) is omitted.

FIG. 10 illustrates a positional relation between an inorganic insulation film 23 and an organic insulation film 24, and other components according to the fourth embodiment in a plan view. In FIG. 10, the inorganic insulation film 23 is given a hatch pattern drawn downward to the right, which is relatively low in density, while the organic insulation film 24 is given a hatch pattern drawn upward to the right, which is relatively high in density.

In the second embodiment (FIG. 6), in a plan view, the edge 28a, which is one of the edges corresponding to the longer sides of the emitter wiring E2 of the second layer, is in contact with the inorganic insulation film 23 throughout its length while the other edge 28b is in contact with the inorganic insulation film 23 only partly. In contrast, in the fourth embodiment, both of a pair of edges 28a and 28b corresponding to the longer sides of an emitter wiring E2 of the second layer are in contact with the inorganic insulation film 23 throughout their lengths. The edges corresponding to the shorter sides of the emitter wiring E2 of the second layer are in contact with the organic insulation film 24 approximately throughout their lengths and are not in contact with the inorganic insulation film 23.

Excellent effects of the fourth embodiment are described below.

In stress caused by a difference in coefficient of linear expansion between the emitter wiring E2 of the second layer and the substrate 20 (FIGS. 4 and 5), components in the first direction D1 as a longitudinal direction of the emitter wiring E2 are larger than components in the second direction D2. In the fourth embodiment, both of the edges of the emitter wiring E2 that are parallel in the first direction D1 are in contact with the inorganic insulation film 23 throughout their lengths and thus, stress of components in the first direction D1 can be suppressed effectively.

Fifth Embodiment

Figure 11:
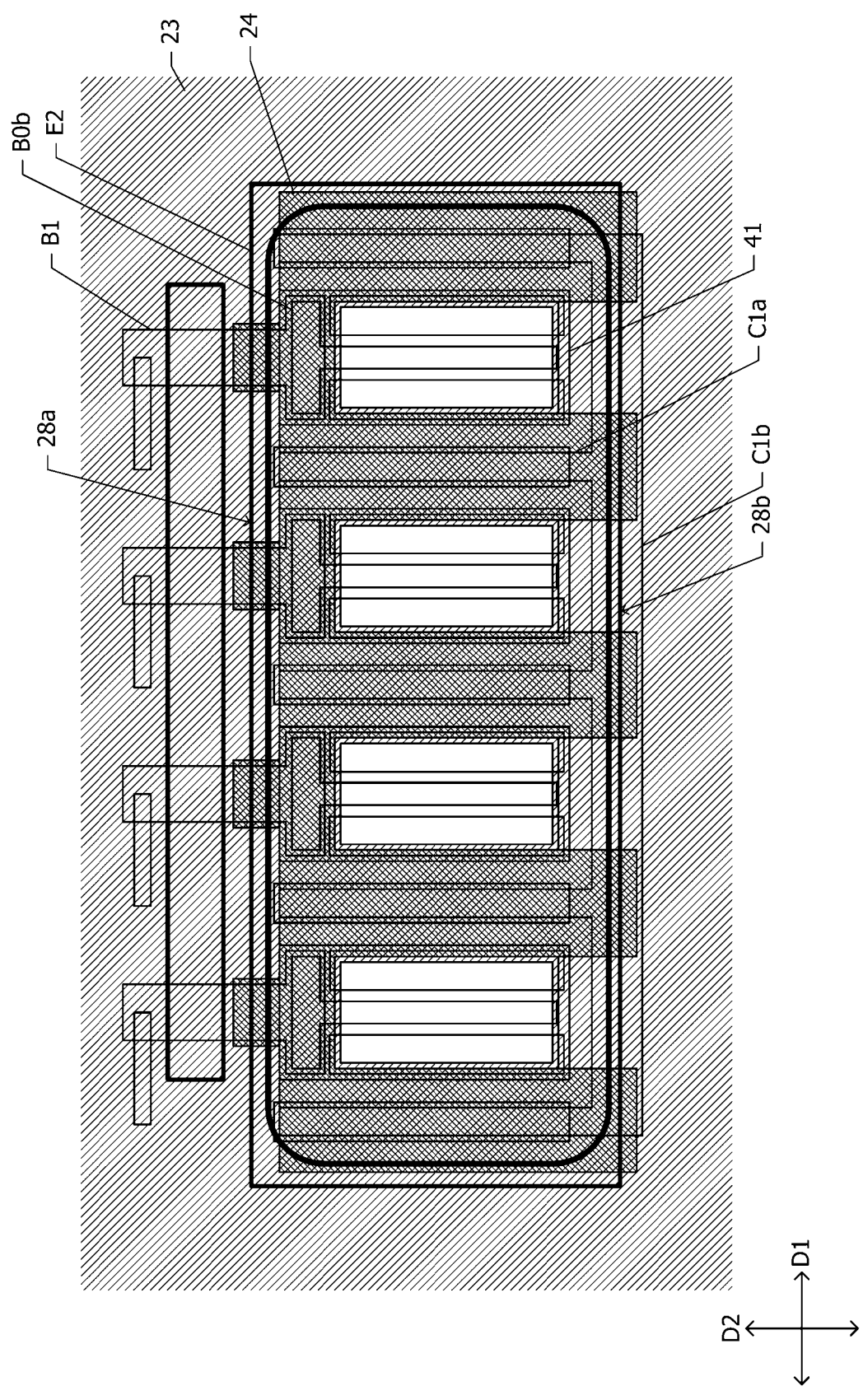
FIG. 11 illustrates a positional relation between an inorganic insulation film and an organic insulation film, and other components according to a fifth embodiment in a plan view.

With reference to FIG. 11, a semiconductor device according to a fifth embodiment is described below. Hereinafter, the description of a configuration common to the semiconductor device according to the second embodiment (FIGS. 3 to 6) is omitted.

FIG. 11 illustrates a positional relation between an inorganic insulation film 23 and an organic insulation film 24, and other components according to the fifth embodiment in a plan view. In FIG. 11, the inorganic insulation film 23 is given a hatch pattern drawn downward to the right, which is relatively low in density, while the organic insulation film 24 is given a hatch pattern drawn upward to the right, which is relatively high in density.

In the second embodiment (FIG. 6), in a plan view, the edge 28a as one of the edges corresponding to the longer sides of the emitter wiring E2 of the second layer, which is toward the base wirings B1, is in contact with the inorganic insulation film 23 throughout its length while the other edge 28b is in contact with the inorganic insulation film 23 only partly. In contrast, in the fifth embodiment, the organic insulation film 24 is present in portions where an edge 28a of an emitter wiring E2 of the second layer and base wirings B1 cross. Thus, in the crossing portions, the edge 28a of the emitter wiring E2 is not in contact with the inorganic insulation film 23. In the regions except the crossing portions, the edge 28a of the emitter wiring E2 that corresponds to the longer side toward the base wirings B1 is in contact with the inorganic insulation film 23. That is, in the edge 28a corresponding to the longer side of the emitter wiring E2 of the second layer toward the base wirings B1, portions in contact with the inorganic insulation film 23 and portions not in contact with the inorganic insulation film 23 are alternately positioned in a first direction D1.

Similar to the second embodiment (FIG. 6), an edge 28b of the emitter wiring E2 of the second layer that corresponds to the longer side toward a collector common wiring C1b, is not in contact with the inorganic insulation film 23 in positions in which collector extended wirings C1a are arranged in the first direction D1 while being in contact with the inorganic insulation film 23 in other positions.

The collector extended wirings C1a and the base wirings B1 are alternately arranged in the first direction D1. Thus, the respective centers of a plurality of portions that are included in the edge 28a as one of the edges corresponding to a pair of longer sides of the emitter wiring E2 of the second layer and are in contact with the inorganic insulation film 23 and the respective centers of a plurality of portions that are included in the other edge 28b and are in contact with the inorganic insulation film 23 are different in position in the first direction D1 when the centers are in the first direction D1. More specifically, the respective centers of a plurality of portions that are in contact with the inorganic insulation film 23 on one of the edges, 28a, of the emitter wiring E2 of the second layer and the respective centers of a plurality of portions that are in contact with the inorganic insulation film 23 on the other edge 28b are alternately positioned in the first direction D1 when the centers are in the first direction D1.

Excellent effects of the fifth embodiment are described below. Also in the fifth embodiment, similar to the second embodiment, concentration of thermal stress on the mesa-like multilayer bodies 41 can be lessened. As a result, destruction of the unit transistor 40 due to thermal stress can be suppressed.

Moreover, in the fifth embodiment, in a plan view, the organic insulation film 24 lies in all of the regions in which the base wirings B1 of the first layer and the emitter wiring E2 of the second layer overlap. Thus, parasitic capacitance between the base wirings B1 and the emitter wiring E2 can be further reduced.

Sixth Embodiment

Figure 12:
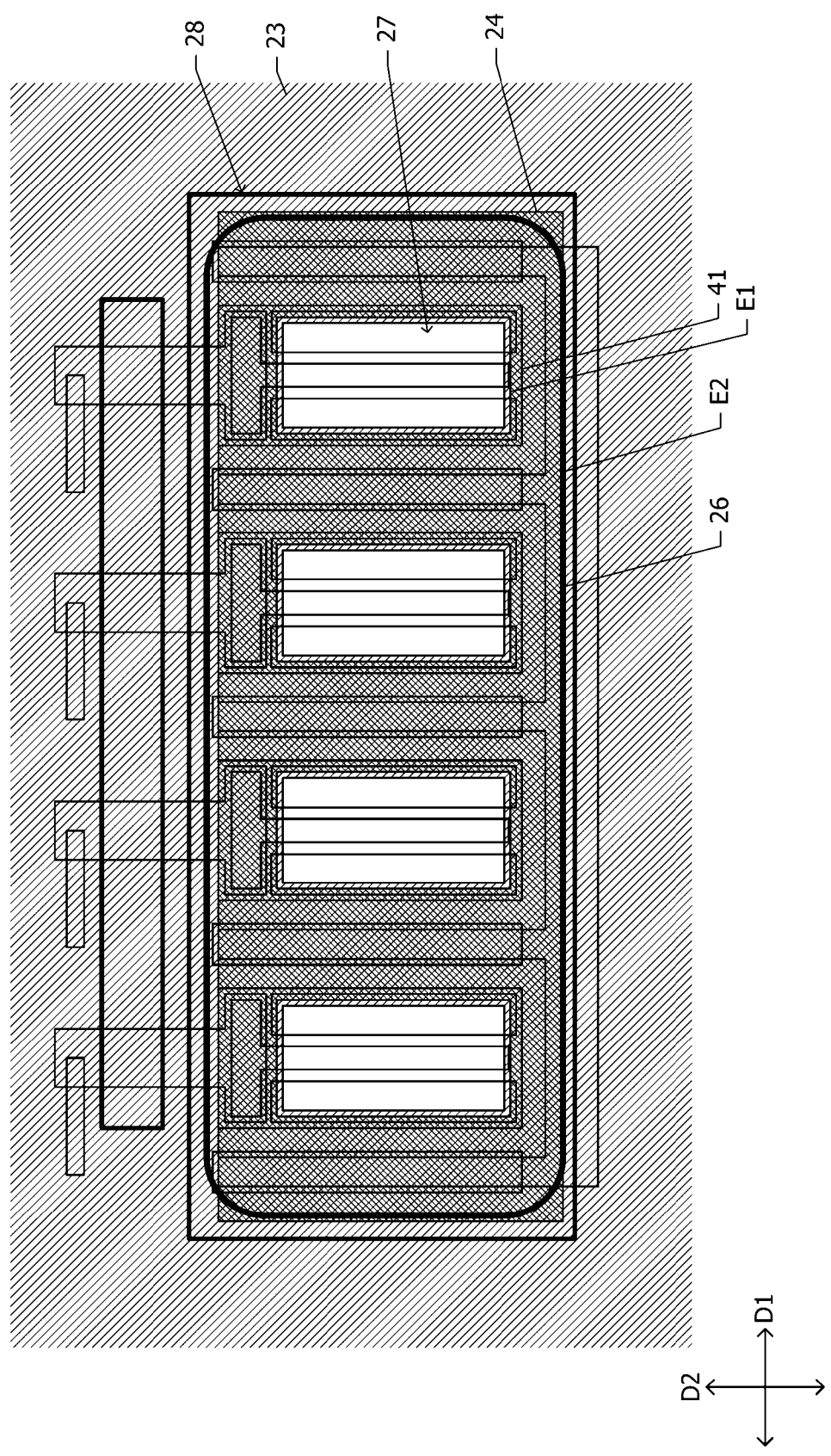
FIG. 12 illustrates a positional relation between an inorganic insulation film and an organic insulation film, and other components according to a sixth embodiment in a plan view.

With reference to FIG. 12, a semiconductor device according to a sixth embodiment is described below. Hereinafter, the description of a configuration common to the semiconductor device according to the fourth embodiment (FIG. 10) is omitted.

FIG. 12 illustrates a positional relation between an inorganic insulation film 23 and an organic insulation film 24, and other components according to the sixth embodiment in a plan view. In FIG. 12, the inorganic insulation film 23 is given a hatch pattern drawn downward to the right, which is relatively low in density, while the organic insulation film 24 is given a hatch pattern drawn upward to the right, which is relatively high in density.

In the fourth embodiment (FIG. 10), the edges 28a and 28b corresponding to a pair of longer sides of the emitter wiring E2 of the second layer are in contact with the inorganic insulation film 23 throughout their lengths and most part of the edges corresponding to a pair of shorter sides are not in contact with the inorganic insulation film 23. In contrast, in the sixth embodiment, edges 28 of an emitter wiring E2 of the second layer are in contact with the inorganic insulation film 23 throughout the perimeter. Further, in a plan view, the organic insulation film 24 is included inside the emitter wiring E2 of the second layer.

Excellent effects of the sixth embodiment are described below. In the sixth embodiment, the edges 28 of the emitter wiring E2 of the second layer are in contact with the inorganic insulation film 23 throughout the perimeter, the effect of lessening concentration of thermal stress on mesa-like multilayer bodies 41 can be further enhanced. In addition, the inorganic insulation film 23 has a property of allowing moisture to pass therethrough less easily than the organic insulation film 24. In the sixth embodiment, the edges 28 of the emitter wiring E2 are in contact with the inorganic insulation film 23 and thus, moisture can be hindered from entering the unit transistors 40 through the organic insulation film 24. As a result, an excellent effect can be obtained, which is increase in resistance to moisture.

Seventh Embodiment

Figure 13:
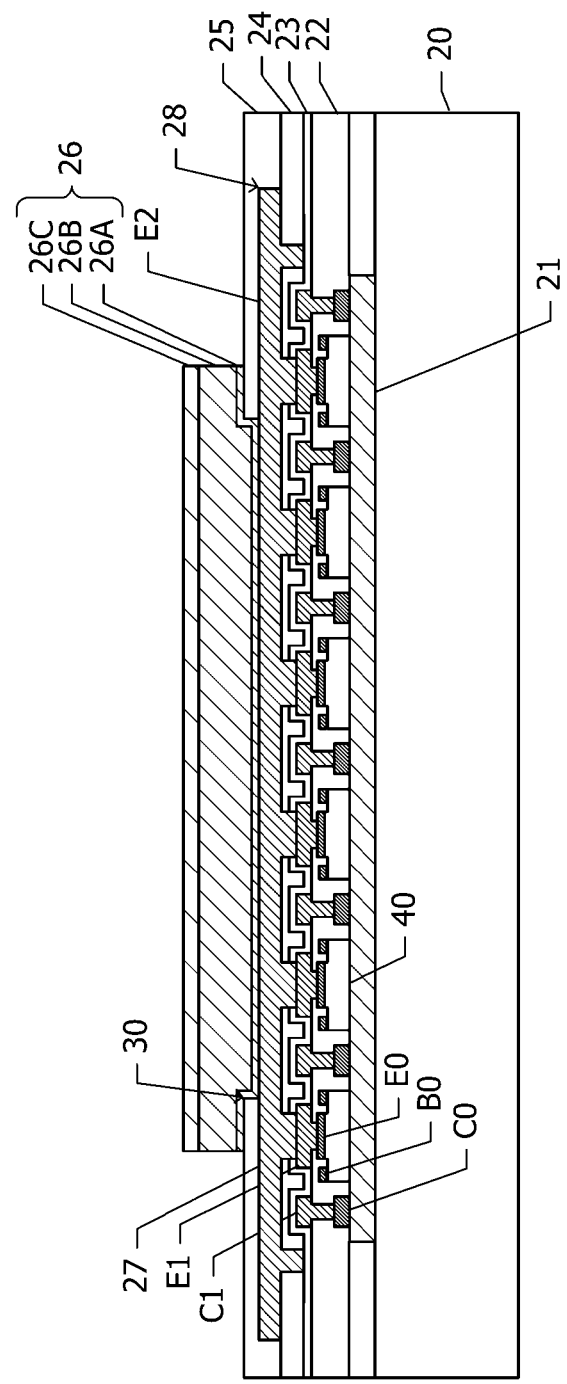
FIG. 13 is a cross-sectional view of a semiconductor device according to a seventh embodiment.

With reference to FIG. 13, a semiconductor device according to a seventh embodiment is described below. Hereinafter, the description of a configuration common to the semiconductor device according to the first embodiment (FIGS. 1A and 1B) is omitted.

FIG. 13 is a cross-sectional view of the semiconductor device according to the seventh embodiment. In the first embodiment (FIG. 1A), the emitter wiring E2 of the second layer is in contact with the inorganic insulation film 23 on an edge thereof, which is the edge 28. In contrast, in the seventh embodiment, an emitter wiring E2 of the second layer is in contact with an inorganic insulation film 23 slightly further inside than an edge 28. The portion in which the emitter wiring E2 of the second layer is in contact with the inorganic insulation film 23 is positioned further outside than an emitter wiring E1 of the first layer in a plan view.

Excellent effects of the seventh embodiment are described below.

Also in the seventh embodiment, the emitter wiring E2 of the second layer is in contact with the inorganic insulation film 23 further outside than the emitter wiring E1 of the first layer in a plan view and thus, concentration of thermal stress on the unit transistors 40 can be suppressed.

Eighth Embodiment

Figure 14A:
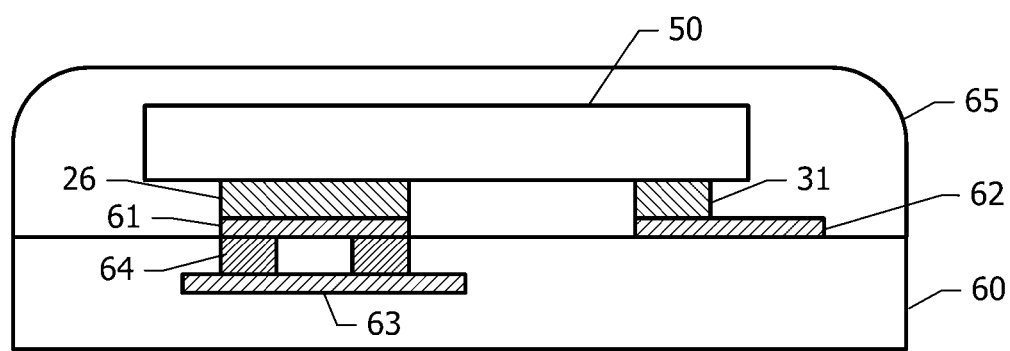
FIG. 14A is a cross-sectional view of a high-frequency module according to an eighth embodiment and FIG. 14B illustrates a positional relation among an emitter bump, a land, a via conductor, and a conductor plate in a plan view.
Figure 14B:
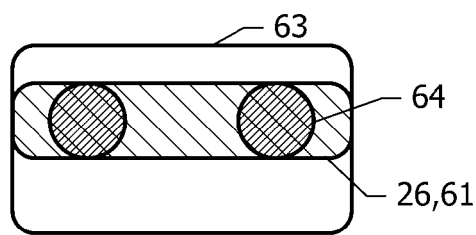

With reference to FIG. 14A and FIG. 14B, a high-frequency module according to an eighth embodiment is described below.

FIG. 14A is a cross-sectional view of the high-frequency module according to the eighth embodiment. The high-frequency module according to the eighth embodiment includes a mounting board 60, and a semiconductor device 50 face-down mounted over the mounting board 60. For example, a low-temperature co-fired multilayer ceramic board, a printed wiring board, or the like is used as the mounting board 60. As the semiconductor device 50, the semiconductor device according to one of the first to seventh embodiments is used.

A plurality of lands, such as lands 61 and 62, are formed on the component mounting surface of the mounting board 60. In addition to an emitter bump 26, another bump 31, such as a bump for signal input or a bump for power supply, is formed on the semiconductor device 50. The lands 61 and 62 of the mounting board 60 are arranged in positions facing the emitter bump 26 and the other bump 31 of the semiconductor device 50, respectively. The emitter bump 26 and the land 61 are coupled using solder or the like, and the other bump 31 and the land 62 are coupled using solder or the like.

For example, surface mount devices that constitute the input matching circuit 54, the output matching circuit 55, and the like and the inductors 56 and 57, illustrated in FIG. 2, are mounted over the mounting board 60. The semiconductor device 50 and the other surface mount devices are sealed with sealing resin 65.

The mounting board 60 includes a conductor plate 63 arranged in an internal layer. The land 61 and the conductor plate 63 are coupled by a plurality of via conductors 64. The conductor plate 63 functions as a ground plane.

FIG. 14B illustrates a positional relation in a plan view among the emitter bump 26, the land 61, the via conductors 64, and the conductor plate 63. The via conductors 64 are each given a hatch pattern drawn upward to the right, which is relatively high in density, while the emitter bump 26 and the land 61 are each given a hatch pattern drawn downward to the right, which is relatively low in density. In a plan view, the emitter bump 26 and the land 61 approximately overlap and each have a shape long in one direction. In a plan view, the emitter bump 26 and the land 61 approximately overlap and each have a shape long in one direction. In a plan view, the plurality of via conductors 64 and the emitter bump 26 overlap at least partly.

Excellent effects of the eighth embodiment are described below.

The heat caused in the plurality of unit transistors 40 (FIG. 1A, etc.) included in the semiconductor device 50 is transferred to the land 61 of the mounting board 60 through the emitter wiring E1 of the first layer, the emitter wiring E2 of the second layer, and the emitter bump 26. The heat transferred to the land 61 is transferred to the conductor plate 63 through the via conductors 64. Thus, the emitter bump 26, the via conductors 64, and the like function as part of a heat dissipation path from the unit transistors 40 of the semiconductor device 50.

Excellent effects of the eighth embodiment are described below. In the eighth embodiment, in a plan view, the plurality of via conductors 64 and the emitter bump 26 overlap at least partly and thermal resistance in the heat dissipation path can be decreased. As a result, heat dissipation performance can be enhanced.

Ninth Embodiment

Figure 15A:
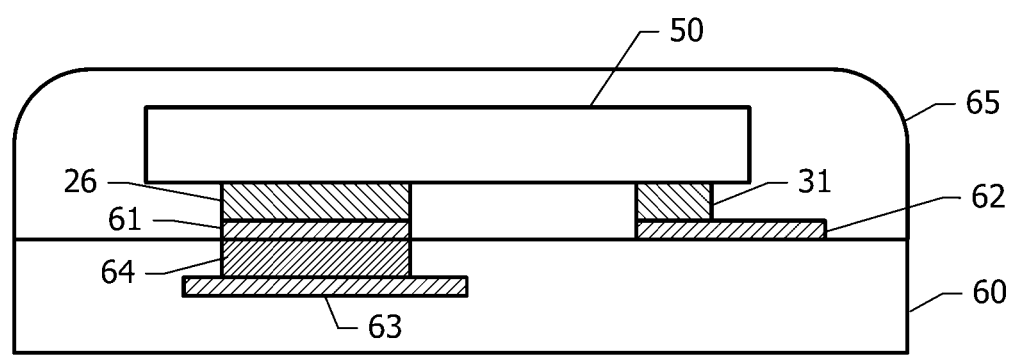
FIG. 15A is a cross-sectional view of a high-frequency module according to a ninth embodiment and FIG. 15B illustrates a positional relation among an emitter bump, a land, a via conductor, and a conductor plate in a plan view.
Figure 15B:
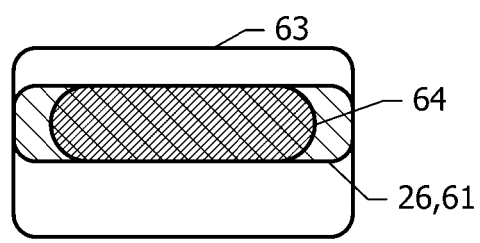

With reference to FIGS. 15A and 15B, a high-frequency module according to a ninth embodiment is described below. Hereinafter, the description of a configuration common to the high-frequency module according to the eighth embodiment (FIGS. 14A and 14B) is omitted.

FIG. 15A is a cross-sectional view of the high-frequency module according to the ninth embodiment and FIG. 15B illustrates a positional relation among an emitter bump 26, a land 61, a via conductor 64, and a conductor plate 63 in a plan view. In the eighth embodiment, the plurality of via conductors 64 that couple the land 61 and the conductor plate 63 are provided. Each of the flat cross sections of the plurality of via conductors 64 is approximately circular. In contrast, in the ninth embodiment, the land 61 and the conductor plate 63 are coupled by a single via conductor, which is the via conductor 64. The flat cross section of the single via conductor 64 has a shape long in a direction parallel to a longitudinal direction of the emitter bump 26.

Excellent effects of the ninth embodiment are described below. In the ninth embodiment, the area of the flat cross section of the via conductor 64 is larger than the total area of the flat cross sections of the plurality of via conductors 64 of the high-frequency module according to the eighth embodiment. Thus, thermal resistance in the heat dissipation path including the via conductors 64 can be further decreased. As a result, heat dissipation performance can be further enhanced.

Tenth Embodiment

Figure 16:
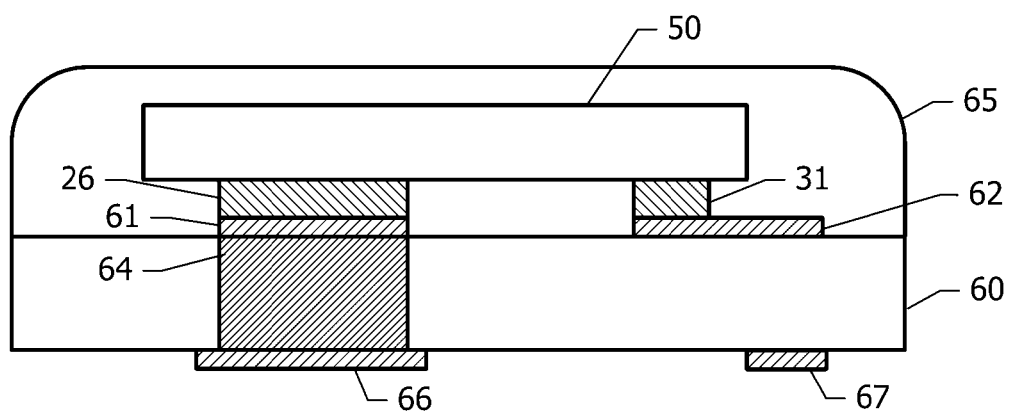
FIG. 16 is a cross-sectional view of a high-frequency module according to a tenth embodiment.

With reference to FIG. 16, a high-frequency module according to a tenth embodiment is described below. Hereinafter, the description of a configuration common to the high-frequency module according to the ninth embodiment (FIGS. 15A and 15B) is omitted.

FIG. 16 is a cross-sectional view of the high-frequency module according to the tenth embodiment. In the ninth embodiment (FIG. 15A), the conductor plate 63 coupled to the land 61 with the via conductor 64 interposed therebetween is arranged in an internal layer of the mounting board 60. In contrast, in the tenth embodiment, a conductor plate 66 is provided on a surface opposite the component mounting surface of a mounting board 60, which is hereinafter referred to as the lower surface, instead of the conductor plate 63 in the internal layer. Further, a conductor plate 67 or the like is provided on the lower surface in addition to the conductor plate 66. The conductor plates 66 and 67 are used as terminals for external coupling. The via conductor 64 couples the land 61 and the conductor plate 66. The conductor plates 66 and 67 are coupled to another circuit component, such as a mother board or the like.

Excellent effects of the tenth embodiment are described below. In the tenth embodiment, the heat caused in the unit transistors 40 (FIG. 1A, etc.) of the semiconductor device 50 is transferred to the conductor plate 66 through the emitter bump 26, the land 61, and the via conductor 64. The circuit component coupled to the conductor plate 66, such as the mother board, functions as a heat sink. Accordingly, heat dissipation performance can be further enhanced.

Eleventh Embodiment

Figure 17:
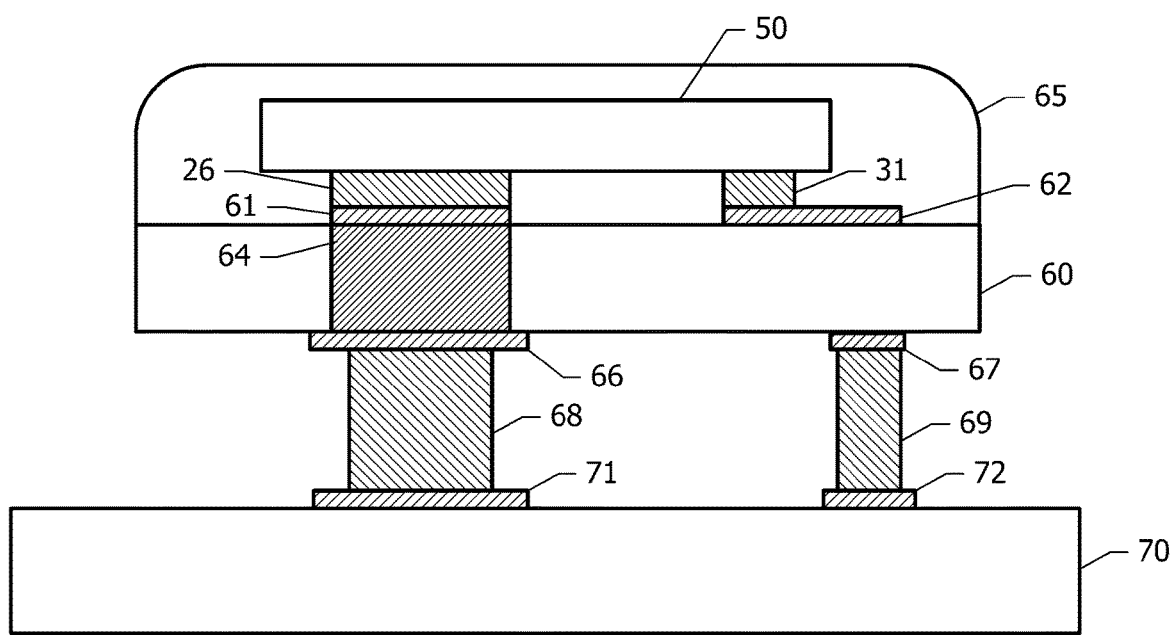
FIG. 17 is a cross-sectional view of a high-frequency module according to an eleventh embodiment.

With reference to FIG. 17, a high-frequency module according to an eleventh embodiment is described below. Hereinafter, the description of a configuration common to the high-frequency module according to the tenth embodiment (FIG. 16) is omitted.

FIG. 17 is a cross-sectional view of the high-frequency module according to the eleventh embodiment. The high-frequency module according to the eleventh embodiment includes pillar bumps 68 and 69 provided on conductor plates 66 and 67, respectively, in addition to the configuration of the high-frequency module according to the tenth embodiment (FIG. 16). The pillar bumps 68 and 69 are formed from copper for example.

Lands 71 and 72 are provided on the component mounting surface of a mother board 70. The pillar bumps 68 and 69 are coupled to the lands 71 and 72, respectively, using solder or the like.

Excellent effects of the eleventh embodiment are described below. In the eleventh embodiment, the heat caused in the unit transistors 40 (FIG. 1A, etc.) of the semiconductor device 50 is transferred to the land 71 through an emitter bump 26, a land 61, a via conductor 64, a conductor plate 66, and the pillar bump 68. Heat dissipation performance can be further enhanced by the mother board 70 functioning as a heat sink.

It is preferable that thermal resistance of a heat dissipation path from the unit transistors 40 of the semiconductor device 50 to the land 71 of the mother board 70 be made small so as to enhance the heat dissipation performance. For example, in the eleventh embodiment, the cross-sectional area of the heat dissipation path is made large so that the shape of the flat cross section of the via conductor 64 is long in one direction. As the thermal resistance of the heat dissipation path becomes smaller, however, heat can be transferred to the semiconductor device 50 more easily in a heating process, such as reflow treatment or the like, in mounting the high-frequency module on the mother board 70. Accordingly, thermal stress can be caused in the semiconductor device 50 more easily.

In the eleventh embodiment, the semiconductor device according to one of the first to seventh embodiments is used as the semiconductor device 50. Thus, the thermal stress added to the semiconductor device 50 is dispersed to regions except the unit transistors 40 and concentration of the thermal stress on the unit transistors 40 can be lessened. As a result, damage on the unit transistors 40 in the heating process, such as reflow treatment or the like, can be suppressed. Hence, if the arrangement and cross sectional shape of the via conductor 64 are employed so that the thermal resistance of the heat dissipation path is small, excellent effects of using the semiconductor device according to one of the first to seventh embodiments as the semiconductor device 50 can be exhibited more clearly.

Twelfth Embodiment

Figure 18:
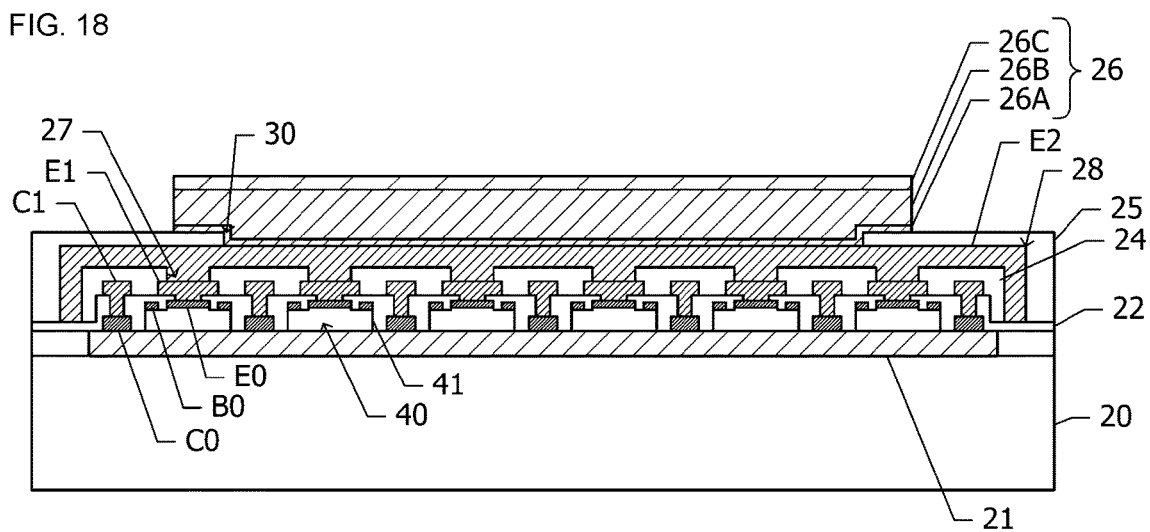
FIG. 18 is a cross-sectional view of a semiconductor device according to a twelfth embodiment.

With reference to FIG. 18, a semiconductor device according to a twelfth embodiment is described below. Hereinafter, the description of a configuration common to the semiconductor device according to the first embodiment (FIGS. 1A and 1B) is omitted.

FIG. 18 is a cross-sectional view of the semiconductor device according to the twelfth embodiment. Although the material of the insulation film 22 is not particularly mentioned in the first embodiment, in the twelfth embodiment, an inorganic material, such as SiN, SiO, SiON, or the like, is used for the insulation film 22 for example. Further, in the first embodiment, the inorganic insulation film 23 is arranged so as to cover the emitter wirings E1 and the collector wirings C1 of the first layer and the organic insulation film 24 is arranged over the inorganic insulation film 23. In contrast, in the twelfth embodiment, an inorganic insulation film 23 is not arranged and an organic insulation film 24 is arranged directly on emitter wirings E1 and collector wirings C1 of the first layer.

In outer side portions of the regions in which the emitter wiring E1 and the collector wiring C1 of the first layer are arranged, an emitter wiring E2 of the second layer is in contact with the insulation film 22 made from an inorganic material.

Excellent effects of the twelfth embodiment are described below.

In the twelfth embodiment, the emitter wiring E2 of the second layer is in contact with the insulation film 22 having the Young's modulus that is larger than the Young's modulus of the organic insulation film 24. Accordingly, thermal stress is dispersed to the contact portion between the emitter wiring E2 and the insulation film 22 and as a result, occurrence of deformation of the emitter wiring E2 of the second layer can be hindered. Accordingly, similar to the first embodiment, destruction of the unit transistors 40 due to thermal stress can be suppressed.

Each of the embodiments described above is an example and as a matter of course, partial replacements or combinations of the configurations presented in different ones of the embodiments are possible. Similar actions and effects by similar configurations in two or more of the embodiments are not mentioned in every embodiment. Further, the present disclosure is not limited to the above-described embodiments. For example, it may be obvious to those skilled in the art that various changes, modifications, combinations, etc. are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   at least one unit transistor arranged over a substrate;
   a first wiring that is arranged over the at least one unit transistor and serves as a path of current that flows to each of the at least one unit transistor;
   an inorganic insulation film that is arranged over the first wiring, is provided with at least one first opening overlapping a partial region of the first wiring in a plan view, and is configured with an inorganic insulation material;
   an organic insulation film that is arranged over the inorganic insulation film and is configured with an organic insulation material; and
   a second wiring that is arranged over the organic insulation film and the inorganic insulation film and is coupled to the first wiring through the first opening, wherein
   in a plan view, a region in which the organic insulation film is not arranged is provided outside a region in which the first wiring is arranged, and the second wiring is in contact with the inorganic insulation film outside the region in which the first wiring is arranged.

2. The semiconductor device according to claim 1, wherein
   in a plan view, at least part of an edge of the second wiring is in contact with the inorganic insulation film.

3. The semiconductor device according to claim 1, wherein
   the at least one unit transistor is a plurality of unit transistors arranged in parallel in a first direction, and
   in a plan view, a measurement of the second wiring in the first direction is larger than a measurement in a second direction perpendicular to the first direction, the second wiring includes pn junction interfaces of the plurality of unit transistors, the second wiring has an edge parallel to the first direction, and at least part of the edge that the second wiring has and is parallel to the first direction is in contact with the inorganic insulation film.

4. The semiconductor device according to claim 3, wherein
   the part being included in the edge that the second wiring has and is parallel to the first direction and being in contact with the inorganic insulation film is a plurality of portions provided while spaced in the first direction.

5. The semiconductor device according to claim 4, wherein
   the second wiring has two edges parallel to the first direction in a plan view, and respective centers of the plurality of portions that are in contact with the inorganic insulation film on one edge of the two edges and respective centers of the plurality of portions that are in contact with the inorganic insulation film on an other edge of the two edges are different in position in the first direction, the centers being in the first direction.

6. The semiconductor device according to claim 5, wherein
   the respective centers of the plurality of portions that are in contact with the inorganic insulation film on the one edge of the second wiring and the respective centers of the plurality of portions that are in contact with the inorganic insulation film on the other edge are alternately positioned, the centers being in the first direction.

7. The semiconductor device according to claim 3, wherein
   respective pn junction interfaces of the plurality of unit transistors each have a shape long in the second direction in a plan view,
   the second wiring includes the respective pn junction interfaces of the plurality of unit transistors in a plan view,
   the first opening is provided so as to correspond to each of the plurality of unit transistors, and the first opening partly overlaps the pn junction interface of corresponding one of the plurality of unit transistors, and
   in a plan view, a region in which the organic insulation film is not arranged and that is long in the second direction is provided for each first opening.

8. The semiconductor device according to claim 1, further comprising:
   a protection film that is arranged over the second wiring and is provided with a bump opening included in the second wiring in a plan view; and
   a bump that is arranged over the protection film and is coupled to the second wiring through the bump opening.

9. The semiconductor device according to claim 8, wherein
   in a plan view, an area of a region in which the bump and the organic insulation film overlap is less than 50% of an area of the bump.

10. A high-frequency module comprising:
    the semiconductor device according to claim 8; and
    a mounting board over which the semiconductor device is mounted,
    the mounting board including
       a land that is arranged in a position opposite the bump and is coupled to the bump,
       a conductor plate that is arranged in a position different from the position of the land in a thickness direction of the mounting board and partly overlaps the land in a plan view, and
       a via conductor that couples the land and the conductor plate, wherein
    in a plan view, the bump and the via conductor partly overlap.

11. The high-frequency module according to claim 10, wherein
    in a plan view, the bump has a shape long in one direction and the via conductor has a shape long in a direction parallel to a longitudinal direction of the bump.

12. The high-frequency module according to claim 10, wherein
    the conductor plate is provided on a surface of the mounting board, the surface being opposite a surface on which the land is provided, and
    the mounting board further includes a pillar bump arranged on the conductor plate.

13. The semiconductor device according to claim 2, wherein
    the at least one unit transistor is a plurality of unit transistors arranged in parallel in a first direction, and
    in a plan view, a measurement of the second wiring in the first direction is larger than a measurement in a second direction perpendicular to the first direction, the second wiring includes pn junction interfaces of the plurality of unit transistors, the second wiring has an edge parallel to the first direction, and at least part of the edge that the second wiring has and is parallel to the first direction is in contact with the inorganic insulation film.

14. The semiconductor device according to claim 4, wherein respective pn junction interfaces of the plurality of unit transistors each have a shape long in the second direction in a plan view, the second wiring includes the respective pn junction interfaces of the plurality of unit transistors in a plan view, the first opening is provided so as to correspond to each of the plurality of unit transistors, and the first opening partly overlaps the pn junction interface of corresponding one of the plurality of unit transistors, and in a plan view, a region in which the organic insulation film is not arranged and that is long in the second direction is provided for each first opening.

15. The semiconductor device according to claim 5, wherein respective pn junction interfaces of the plurality of unit transistors each have a shape long in the second direction in a plan view, the second wiring includes the respective pn junction interfaces of the plurality of unit transistors in a plan view, the first opening is provided so as to correspond to each of the plurality of unit transistors, and the first opening partly overlaps the pn junction interface of corresponding one of the plurality of unit transistors, and in a plan view, a region in which the organic insulation film is not arranged and that is long in the second direction is provided for each first opening.

16. The semiconductor device according to claim 2, further comprising:

a protection film that is arranged over the second wiring and is provided with a bump opening included in the second wiring in a plan view; and a bump that is arranged over the protection film and is coupled to the second wiring through the bump opening.

17. A high-frequency module comprising:

the semiconductor device according to claim 9; and a mounting board over which the semiconductor device is mounted, the mounting board including a land that is arranged in a position opposite the bump and is coupled to the bump, a conductor plate that is arranged in a position different from the position of the land in a thickness direction of the mounting board and partly overlaps the land in a plan view, and a via conductor that couples the land and the conductor plate, wherein in a plan view, the bump and the via conductor partly overlap.

18. The high-frequency module according to claim 11, wherein the conductor plate is provided on a surface of the mounting board, the surface being opposite a surface on which the land is provided, and the mounting board further includes a pillar bump arranged on the conductor plate.

19. A semiconductor device comprising:

at least one unit transistor arranged over a substrate;

a first wiring that is arranged over the at least one unit transistor and serves as a path of current that flows to each of the at least one unit transistor;

a first insulation film that is arranged over the first wiring and is provided with at least one first opening overlapping a partial region of the first wiring in a plan view;

a second insulation film arranged over the first insulation film; and a second wiring that is arranged over the second insulation film and the first insulation film and is coupled to the first wiring through the first opening, wherein Young's modulus of the first insulation film is larger than Young's modulus of the second insulation film, and in a plan view, a region in which the second insulation film is not arranged is provided outside a region in which the first wiring is arranged, and the second wiring is in contact with the first insulation film outside the region in which the first wiring is arranged.

20. The semiconductor device according to claim 19, wherein the first insulation film is configured with an inorganic insulation material and the second insulation film is configured with an organic insulation material.

* * * * *